(12) United States Patent
Teraguchi et al.

(10) Patent No.: US 8,385,860 B2
(45) Date of Patent: Feb. 26, 2013

(54) POWER DETECTOR AND WIRELESS DEVICE

(75) Inventors: Takayuki Teraguchi, Kanagawa-ken (JP); Masahiro Hasegawa, Kanagawa-ken (JP); Noriyoshi Odaki, Kanagawa-ken (JP); Shigehiro Hosoi, Hyogo-ken (JP); Takahiro Nakagawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 157 days.

(21) Appl. No.: 13/053,506

(22) Filed: Mar. 22, 2011

(65) Prior Publication Data

US 2012/0008669 A1 Jan. 12, 2012

(30) Foreign Application Priority Data

Jul. 7, 2010 (JP) .................................. 2010-154659
Jan. 28, 2011 (JP) .................................. 2011-017110

(51) Int. Cl.
*H04B 1/04* (2006.01)
*H04B 17/00* (2006.01)

(52) U.S. Cl. ............... 455/127.1; 455/115.1; 455/251.1; 455/343.1

(58) Field of Classification Search ............... 455/127.1, 455/115.1, 251.1, 343.1, 234.1, 341, 240.1, 455/241.1, 250.1, 253.2, 293, 522, 126; 330/140, 330/285, 296, 302, 103, 133; 375/224
See application file for complete search history.

(56) References Cited

U.S. PATENT DOCUMENTS

| 6,172,549 | B1 | 1/2001 | Gilbert |
| 6,549,057 | B1 * | 4/2003 | Gilbert ........................ 327/349 |
| 7,259,620 | B2 * | 8/2007 | Zou ................................. 330/51 |
| 7,342,431 | B2 * | 3/2008 | Zou ............................... 327/349 |
| 7,440,738 | B2 * | 10/2008 | Zhang et al. ............... 455/234.1 |
| 7,469,133 | B2 * | 12/2008 | Zhang ......................... 455/234.1 |
| 7,545,303 | B1 * | 6/2009 | Silva et al. .................... 341/143 |
| 7,565,124 | B2 * | 7/2009 | Lee et al. ................... 455/234.1 |
| 7,659,707 | B2 * | 2/2010 | Eken et al. ................. 324/76.11 |
| 7,697,909 | B2 * | 4/2010 | Kouwenhoven ........... 455/226.1 |
| 7,944,196 | B2 * | 5/2011 | Eken et al. ................. 324/76.11 |
| 7,977,947 | B1 * | 7/2011 | Jones et al. .................... 324/522 |
| 2009/0258640 | A1 * | 10/2009 | Persson et al. ................ 455/425 |
| 2010/0330938 | A1 * | 12/2010 | Yin ............................. 455/127.1 |

OTHER PUBLICATIONS

Zhou, et al.; A Low-Power Ultra-Wideband CMOS True RMS Power Detector; IEEE Transactions on Microwave Theory and Techniques, vol. 56, No. 5, May 2008, pp. 1052-1058.

* cited by examiner

*Primary Examiner* — Pablo Tran
(74) *Attorney, Agent, or Firm* — Turocy & Watson, LLP

(57) ABSTRACT

According to one embodiment, a power detector includes a reference voltage generator, a square signal generator, a detection circuit, and an output circuit. The reference voltage generator is configured to receive a bias voltage and generate a reference voltage. The square signal generator is configured to receive a voltage having a high frequency input voltage superimposed on the bias voltage and output a signal including the reference voltage, a voltage of a square of the high frequency input voltage, and a high-frequency signal. The detection circuit has a first lowpass filter, a first operational amplifier configured to amplify error between an output voltage of the first lowpass filter and the reference voltage and output the error as a control voltage, and a feedback transistor configured to feed a feedback current according to the control voltage back to an output terminal of the square signal generator.

20 Claims, 33 Drawing Sheets

| 56a | 56b | Ron (kΩ) |
|---|---|---|
| 0 | 0 | 6.8 |
| 0 | 1 | 7.6 |
| 1 | 0 | 8.4 |
| 1 | 1 | 9.2 |

| OFFSET (μA) | MEASURED CURRENT VALUE (μA) BEFORE DISCONNECTING FUSE | FUSE ('1' INDICATES DISCONNECTING) | | | | MEASURED CURRENT VALUE (μA) AFTER DISCONNECTING FUSE |
|---|---|---|---|---|---|---|
| | | 52a | 52b | 52c | 52d | |
| -5 ~ -4.375 | 0 ~ 0.3125 | 0 | 0 | 0 | 0 | 0 ~ 0.3125 |
| -4.375 ~ -3.75 | 0.3125 ~ 0.625 | 0 | 0 | 0 | 1 | 0 ~ 0.3125 |
| -3.75 ~ -3.125 | 0.625 ~ 0.9375 | 0 | 0 | 1 | 0 | 0 ~ 0.3125 |
| -3.125 ~ -2.5 | 0.9375 ~ 1.25 | 0 | 0 | 1 | 1 | 0 ~ 0.3125 |
| -2.5 ~ -1.875 | 1.25 ~ 1.5625 | 0 | 1 | 0 | 0 | 0 ~ 0.3125 |
| -1.875 ~ -1.25 | 1.5625 ~ 1.875 | 0 | 1 | 0 | 1 | 0 ~ 0.3125 |
| -1.25 ~ -0.625 | 1.875 ~ 2.1875 | 0 | 1 | 1 | 0 | 0 ~ 0.3125 |
| -0.625 ~ 0 | 2.1875 ~ 2.5 | 0 | 1 | 1 | 1 | 0 ~ 0.3125 |
| 0 ~ 0.625 | 2.5 ~ 2.8125 | 1 | 0 | 0 | 0 | 0 ~ 0.3125 |
| 0.625 ~ 1.25 | 2.8125 ~ 3.125 | 1 | 0 | 0 | 1 | 0 ~ 0.3125 |
| 1.25 ~ 1.875 | 3.125 ~ 3.4375 | 1 | 0 | 1 | 0 | 0 ~ 0.3125 |
| 1.875 ~ 2.5 | 3.4375 ~ 3.75 | 1 | 0 | 1 | 1 | 0 ~ 0.3125 |
| 2.5 ~ 3.125 | 3.75 ~ 4.0625 | 1 | 1 | 0 | 0 | 0 ~ 0.3125 |
| 3.125 ~ 3.75 | 4.0625 ~ 4.375 | 1 | 1 | 0 | 1 | 0 ~ 0.3125 |
| 3.75 ~ 4.375 | 4.375 ~ 4.6875 | 1 | 1 | 1 | 0 | 0 ~ 0.3125 |
| 4.375 ~ 5 | 4.6875 ~ 5 | 1 | 1 | 1 | 1 | 0 ~ 0.3125 |

FIG. 33

ND WIRELESS
POWER DETECTOR AND WIRELESS DEVICE

CROSS-REFERENCE TO RELATED APPLICATIONS

This application is based upon and claims the benefit of priority from Japanese Patent Application No. 2010-154659, filed on Jul. 7, 2010 and Japanese Patent Application No. 2011-017110, filed on Jan. 28, 2011; the entire contents of which are incorporated herein by reference.

FIELD

Embodiments described herein relate generally to a power detector and a wireless device.

BACKGROUND

In wireless communications devices using radio waves, it is necessary for the device to comply with communication standards in order to efficiently utilize radio waves while preventing interference with the other devices. For example, in mobile phones, it is necessary for the mobile phone to control its transmission power at a specified value, using a power detector that detects transmission power.

In order to accurately detect transmission power for diversified communication standards, it is demanded to provide a wide detectable power range (dynamic range). Moreover, in order to accurately detect transmission power for highly sophisticated, diversified modulation modes, a root-mean-square detector formed of bipolar transistors or the like is used.

BRIEF DESCRIPTION OF THE DRAWINGS

FIGS. 13A, 13B, and 13C show the cases where there are resistance changes at 0%, −20%, and 20%, respectively;

FIG. 16A is illustrated in a table, and FIG. 16B is illustrated in lines.

FIG. 22A shows the state of a clock CLK, FIG. 22B shows the state of a first switch S1, FIG. 22C shows the state of a second switch S2, FIG. 22D shows the state of a third switch S3, and FIG. 22E shows the state of a fourth switch S4;

FIG. 26A shows the state of the clock CLK, FIG. 26B shows the state of the first switch S1, FIG. 26C shows the state of the second switch S2, FIG. 26D shows the state of the third switch S3, and FIG. 26E shows the state of the fourth switch S4;

FIG. 33 is a schematic view illustrating the relationship between the measured current value and the disconnecting value of the input fuse circuit in the power detector illustrated in FIG. 32;

DETAILED DESCRIPTION

Figure 1:
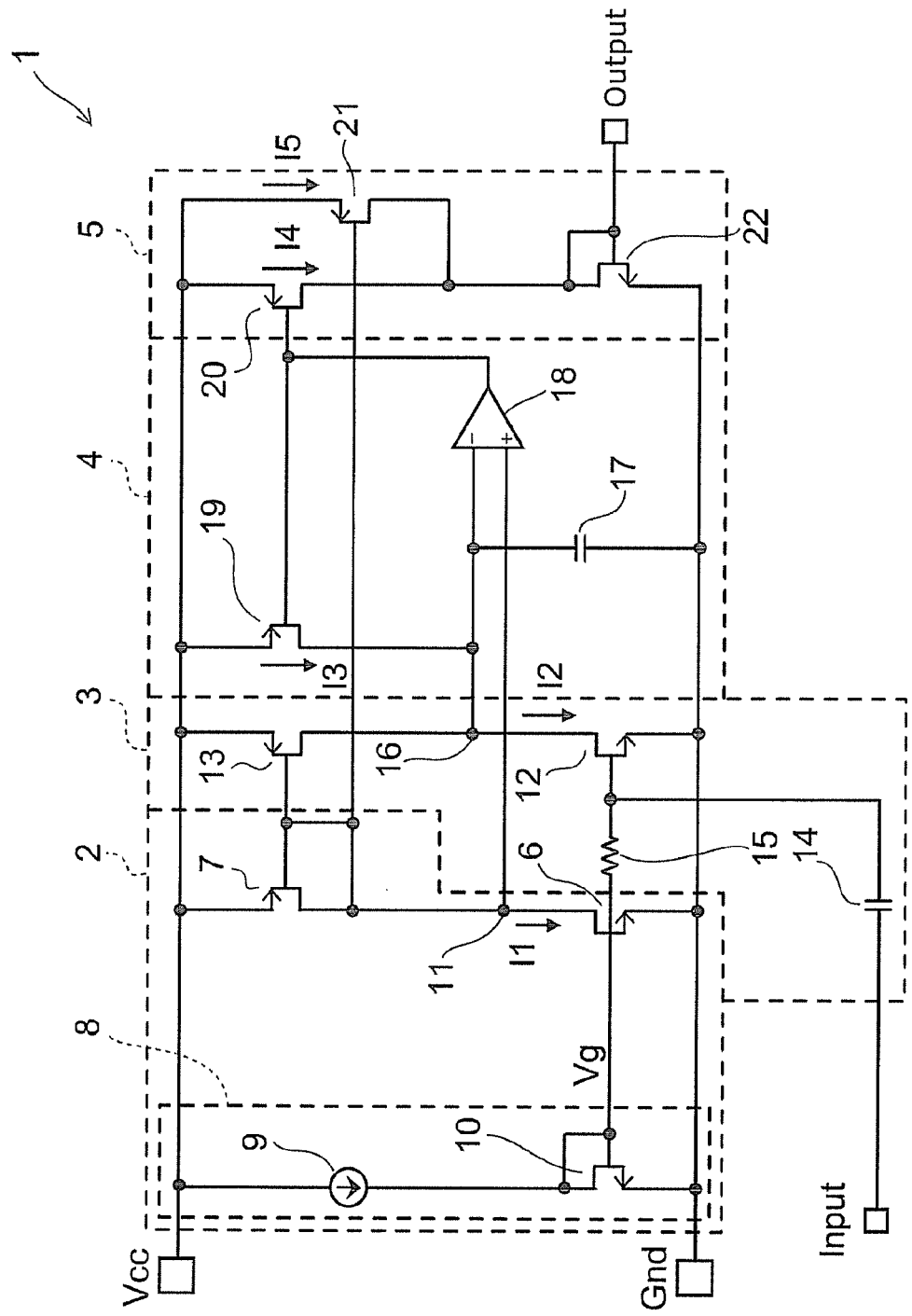
FIG. 1 is a circuit diagram illustrating the configuration of a power detector according to a first embodiment.

In general, according to one embodiment, a power detector includes a reference voltage generator, a square signal generator, a detection circuit, and an output circuit. The reference voltage generator is configured to receive a bias voltage and generate a reference voltage. The square signal generator is configured to receive a voltage having a high frequency input voltage superimposed on the bias voltage and output a signal including the reference voltage, a voltage of a square of the high frequency input voltage, and a high-frequency signal. The detection circuit has a first lowpass filter configured to filter out the high-frequency signal from the output signal of the square signal generator and output a mean value, a first operational amplifier configured to amplify error between an output voltage of the first lowpass filter and the reference voltage and output the error as a control voltage, and a feedback transistor configured to feed a feedback current according to the control voltage back to an output terminal of the square signal generator. The detection circuit is configured to reduce the error between the output voltage of the first lowpass filter and the reference voltage to detect high frequency power based on the feedback current. The output circuit is configured to output a voltage according to the control voltage.

Embodiments of the invention will now be described in detail with reference to the drawings. In the specification and drawings, components similar to those described or illustrated in a drawing thereinabove are marked with like reference numerals, and a detailed description is omitted as appropriate. In addition, the low level logical value is expressed by L, and the high level logical value is expressed by H.

First Embodiment

FIG. 1 is a circuit diagram illustrating the configuration of a power detector according to a first embodiment.

As illustrated in FIG. 1, a power detector 1 includes a reference voltage generator 2, a square signal generator 3, a detection circuit 4, and an output circuit 5.

The power detector 1 is a circuit that raises a high frequency input voltage Input to the second power to detect instantaneous power, detects input signal power as mean power from a mean value (square mean value) of the square of the high frequency input voltage Input, and outputs it as an output signal Output.

The reference voltage generator 2 has a first transistor 6, a first load circuit 7, and a bias circuit 8.

The first transistor 6 is formed of an N-channel MOSFET (hereinafter referred to as NMOS). The source of the first transistor 6 is connected to the ground, and a supply voltage Vcc is supplied to the drain through the first load circuit 7. A bias voltage Vg is supplied to the gate of the first transistor 6 from the bias circuit 8.

The first load circuit 7 is formed of a P-channel MOSFET (hereinafter referred to as PMOS) having the gate connected to the drain. The gate and drain of the first load circuit 7 are connected to the drain of the first transistor 6, and the supply voltage Vcc is supplied to the source of the first load circuit 7.

The bias circuit 8 has a current generator 9 and a transistor 10, and generates the bias voltage Vg from the supply voltage Vcc. The bias voltage Vg causes the first transistor 6 to operate in the saturation region. A drain current (first current) I1 of the first transistor 6 has square low characteristics proportional to the square of a first voltage $V1=Vg-Vt$. Here, Vt is the threshold voltage of the first transistor 6, and the first voltage V1 is an overdrive voltage.

The first transistor 6 is connected between the first load circuit 7 and the ground, and outputs the first current I1 proportional to the square of the first voltage V1.

The reference voltage generator 2 receives the bias voltage Vg, outputs the first current I1 proportional to the square of the first voltage V1 to the first load circuit 7, and generates a reference voltage at a connection point 11 between the first transistor 6 and the first load circuit 7.

The square signal generator 3 has a second transistor 12, a second load circuit 13, a capacitor 14, and a resistor 15.

The second transistor 12 is an NMOS. The source of the second transistor 12 is grounded, and the supply voltage Vcc is supplied to the drain through the second load circuit 13.

The second load circuit 13 is formed of a PMOS in which the gate is connected to the gate of the first load circuit 7. The drain of the second load circuit 13 is connected to the drain of the second transistor 12, and the supply voltage Vcc is supplied to the source of the second load circuit 13. The second load circuit 13 forms a current mirror with the first load circuit 7.

The gate of the second transistor 12 receives the high frequency input voltage Input through the capacitor 14. The gate of the second transistor 12 is connected to the gate of the first transistor 6 through the resistor 15, and supplied with the same bias voltage Vg as that supplied to the first transistor 6. The resistor 15 has such a high resistance that the high frequency input voltage Input does not leak to the first transistor 6.

The gate of the second transistor 12 receives a voltage that the high frequency input voltage Input is superimposed on the bias voltage Vg.

The second transistor 12 is connected between the second load circuit 13 and the ground, amplifies the high frequency input voltage Input, and outputs a second current I2 proportional to the square of a combined voltage of the first voltage V1 and the input voltage Input. The threshold voltage of the second transistor 12 is supposed to be equal to the threshold voltage Vt of the first transistor 6.

The second current I2 has components superimposed thereon: the component proportional to the square of the first voltage V1; the component proportional to the square of the input voltage Input; and the component proportional to a product of the first voltage V1 and the input voltage Input. The component proportional to the square of the first voltage V1 is equal to the first current I1 of the first transistor 6 of the reference voltage generator 2. The component proportional to the square of the input voltage Input includes the mean value (square mean value) of the square of the input voltage Input as a direct-current component, and the harmonic of the input voltage Input as an alternating current component. The square mean value of the input voltage Input is detected to detect input signal power.

The square signal generator 3 amplifies a voltage that the high frequency input voltage Input is superimposed on the bias voltage Vg, generates the second current I2 proportional to the square of the combined voltage of the first voltage V1 and the input voltage Input, and outputs the voltage to the connection point (the output terminal of the square signal generator) 16 between the second transistor 12 and the second load circuit 13. The voltage of the output terminal 16 of the square signal generator 3 is a signal including the reference voltage, the voltage that the high frequency input voltage Input is squared, and the high-frequency signal. The voltage that the high frequency input voltage Input is squared is proportional to the instantaneous value (instantaneous power) of input signal power. In addition, the second current I2 is supplied from the second load circuit 13 and the detection circuit 4, as described below.

The detection circuit 4 has a first lowpass filter 17, a first operational amplifier 18, and a feedback transistor 19.

The first lowpass filter 17 is formed of a capacitor connected between the output terminal 16 of the square signal generator 3 and the ground. The first lowpass filter 17 filters out the high-frequency signal from the output signal of the square signal generator 3, and outputs a mean value obtained from the reference voltage and from the mean value (square mean value) of the voltage that the input voltage Input is squared. In addition, the square mean value of the input voltage Input is proportional to the mean value (mean power) of input signal power. The output voltage of the first lowpass filter 17 is inputted to the inverting input terminal of the first operational amplifier 18.

The non-inverting input terminal of the first operational amplifier 18 is connected to the connection point 11 between the first transistor 6 and the first load circuit 7. The first operational amplifier 18 amplifies the error between the output voltage of the first lowpass filter and the reference voltage, and outputs it as a control voltage.

The feedback transistor 19 is formed of a PMOS, and the control voltage is inputted from the first operational amplifier 18 to the gate. The supply voltage Vcc is supplied to the source of the feedback transistor 19, and the drain is connected to the output terminal 16 of the square signal generator 3.

The feedback transistor 19 is controlled according to the control voltage outputted from the first operational amplifier 18, and outputs the drain current according to the control voltage. The drain current of the feedback transistor 19 is fed back to the output terminal 16 of the square signal generator 3 as a feedback current I3. The feedback current I3 is a part of the second current I2 flowing through the second transistor 12.

A current I2-I3 that the feedback current I3 fed back from the detection circuit 4 is subtracted from the second current I2 flowing through the second transistor 12 is supplied from the second load circuit 13. Because of this, the current supplied from the second load circuit 13 changes according to the feedback current I3.

Moreover, the voltage of the output terminal 16 of the square signal generator 3 changes depending on the change in the current supplied from the second load circuit 13. On the other hand, the reference voltage of the connection point 11 generated by the reference voltage generator 2 is constant. Thus, the voltage inputted to the first operational amplifier 18 changes depending on the control voltage outputted from the first operational amplifier 18.

Here, the gain of the first operational amplifier 18 is set high enough. As a result, the magnitude of the feedback current I3 is controlled by the control voltage, and the error inputted to the non-inverting input terminal and the inverting input terminal of the first operational amplifier 18 is reduced to almost zero.

The second load circuit 13 forms a current mirror with the first load circuit 7. Thus, the error between the output terminal 16 of the square signal generator 3 and the connection point 11 is zero, and the voltage across each of the first and second load circuits 7 and 13 becomes equal to cause the flowing current to be equal. The current I2-I3 flowing through the second load circuit 13 becomes equal to the first current I1 flowing through the first load circuit 7. As a result, the feedback current I3 fed back from the feedback transistor 19 is a current I2-I1, which is a current proportional to the square mean value of the input voltage Input, i.e., electric power. The feedback current I3 flowing through the feedback transistor 19 is proportional to input signal power.

As discussed above, the detection circuit 4 controls the control voltage to reduce the error between the output voltage of the first lowpass filter 17 and the reference voltage. As a result of this, the detection circuit 4 controls the current I2-I3 flowing through the second load circuit 13 to be equal to the first current I1. The detection circuit 4 then causes the feedback current I3 to be proportional to the square mean value of the input voltage Input for detecting input signal power. For example, in the case where the high frequency input voltage Input is a sinusoidal wave at a single frequency having a voltage amplitude Vi, the control voltage is proportional to the voltage amplitude Vi of the high frequency input voltage Input.

The output circuit 5 has a first output transistor 20, a second output transistor 21, and a transistor 22. The output circuit 5 outputs the voltage according to the control voltage.

The first output transistor 20 is a PMOS, and the gate is connected to the gate of the feedback transistor 19. The supply voltage Vcc is supplied to the source of the first output transistor 20, and the control voltage is inputted from the first operational amplifier 18 to the gate. The first output transistor 20 forms a current mirror with the feedback transistor 19.

Consequently, a current I4 flows through the drain of the first output transistor 20, which is proportional to the feedback current I3 flowing through the feedback transistor 19, and proportional to the square mean value of the input voltage Input, i.e., input signal power.

The second output transistor 21 is a PMOS, and the gate is connected to the drain of the first load circuit 7. The supply voltage Vcc is supplied to the source of the second output transistor 21. The second output transistor 21 forms a current mirror with the first load circuit 7 as similar to the second load circuit 13.

Consequently, a current I5 flows through the drain of the second output transistor 21 as a bias current proportional to the first current I1 flowing through the first load circuit 7.

The transistor 22 is an NMOS. The gate and drain of the transistor 22 are connected to the drain of the first output transistor 20 and the drain of the second output transistor 21.

A combined current I4+I5 flows through the transistor 22, which combines the currents I4 and I5 of the first and second output transistors 20 and 21. As a result, a combined voltage of a voltage proportional to the square mean value of the input voltage Input, i.e., input signal power and a voltage of a bias proportional to the first current I1 is outputted to the transistor 22.

In addition, the reason why the current I5 of the second output transistor is combined as the bias current with the current of the first output transistor 20 is to compensate the characteristics of the output voltage of the transistor 22 when power is small.

As discussed above, it is possible that the power detector 1 amplifies the error between the output voltage of the square signal generator 3 and the reference voltage, which is the output of the reference voltage generator 2, through the first lowpass filter 17, detects the square mean value of the input voltage Input, and detects input signal power. Moreover, the power detector 1 causes the detection circuit 4 to feed the feedback current I3 proportional to input signal power back to the output terminal 16 of the square signal generator 3. As a result, the error between the square signal generator 3 and the reference voltage generator 2 is controlled to reduce to almost zero. The output voltage of the square signal generator 3 is independent of the input signal power, and is a constant value almost equal to the reference voltage.

As described above, for example, in the case where the input voltage Input is a sinusoidal wave at a single frequency having a voltage amplitude Vi, the control voltage controlling the feedback transistor 19 that generates the feedback current I3 is proportional to the voltage amplitude Vi of the input voltage Input. As a result, it is possible that the amplitudes of the input voltage and the output voltage of the first operational amplifier 18 are limited and the maximum amplitude of the input voltage Input is made greater, at which the square signal generator 3 operates. Accordingly, it is made possible to implement a wide dynamic range.

COMPARATIVE EXAMPLE

Figure 2:
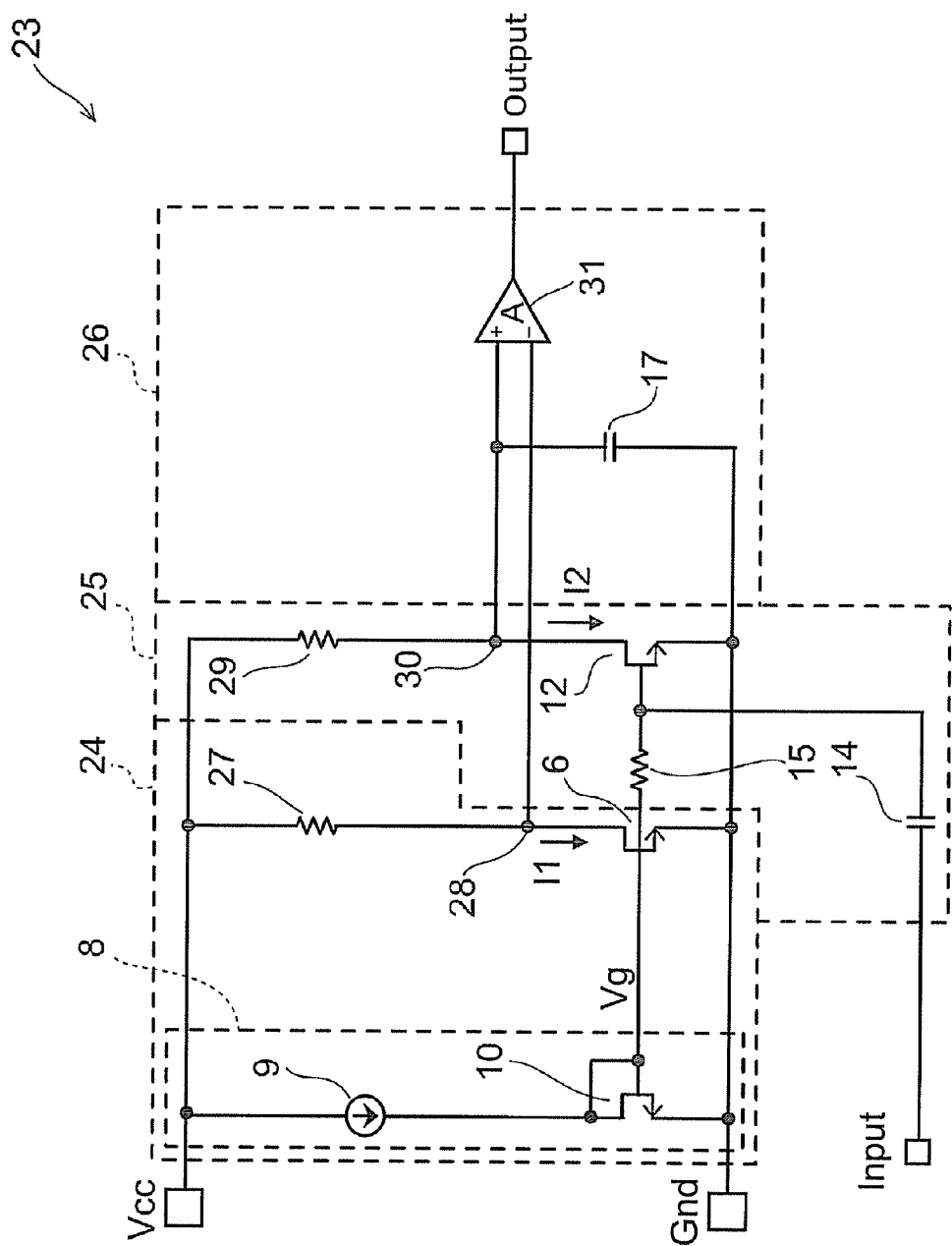
FIG. 2 is a circuit diagram of a power detector of a comparative example.

FIG. 2 is a circuit diagram of a power detector according to a comparative example.

As illustrated in FIG. 2, a power detector 23 according to the comparative example includes amplifiers 24 and 25, and an output circuit 26.

The amplifier 24 has a first transistor 6, a bias circuit 8, and a resistor 27. The amplifier 24 is configured in such a way that the first load circuit 7 of the reference voltage generator 2 illustrated in FIG. 1 is replaced by the resistor 27. The first transistor 6 and the bias circuit 8 are the same as those in the power detector 1 illustrated in FIG. 1.

The resistor 27 is a load circuit for the first transistor 6, which is supplied with the supply voltage Vcc and supplies the first current I1 flowing through the first transistor 6. At a connection point 28 between the resistor 27 and the first transistor 6, the reference voltage is generated as the output voltage of the amplifier 24.

The amplifier 25 has a second transistor 12, a capacitor 14, resistors 15 and 29. The amplifier 25 is configured in such a way that the second load circuit 13 of the square signal generator 3 illustrated in FIG. 1 is replaced by the resistor 29. The second transistor 12, the capacitor 14, and the resistor 15 are the same as those in the square signal generator 3 illustrated in FIG. 1.

The resistor 29 is a load circuit for the second transistor 12, which is supplied with the supply voltage Vcc and supplies the second current I2 flowing through the second transistor 12. The resistance of the resistor 29 is set equal to the resistance of the resistor 27.

In the power detector 23 according to the comparative example, because the detection circuit that controls and feeds back the feedback current I3 is not provided, the second current I2 that amplifies the high frequency input voltage Input and flows through the second transistor 12 is supplied from the resistor 29.

At a connection point 30 between the resistor 29 and the second transistor 12, a voltage that the input voltage Input is amplified is generated as the output voltage of the amplifier 25. At the connection point 30, generated are the reference voltage, a voltage of the square of the input voltage, i.e., a voltage proportional to the instantaneous value of the input signal power, and a voltage superimposed on the high-frequency signal.

The output circuit 26 has a first lowpass filter 17 and an amplifier 31.

The first lowpass filter 17 is the same as that in the power detector 1 illustrated in FIG. 1, which is formed of a capacitor. The first lowpass filter 17 filters out the high-frequency signal from the output voltage of the amplifier 25, and extracts the mean value obtained from the square mean value of the input voltage and the reference voltage. The output voltage of the first the lowpass filter 17 is inputted to the non-inverting input terminal of the amplifier 31.

The reference voltage that is the output voltage of the amplifier 24 is inputted to the inverting input terminal of the amplifier 31. The amplifier 31 is set to A times the gain (A>0). The amplifier 31 amplifies the differential voltage between the output voltages of the amplifiers 24 and 25 by A times the gain, detects input signal power from the above-mentioned mean value, and outputs it as the output signal Output.

The voltage of the output signal Output outputted from the amplifier 31 is the square mean value of the input voltage Input, i.e., A times power, which is proportional to input signal power. In addition, because the bias voltage is not added to the output signal Output at the output circuit 26, the voltage of the output signal Output is also zero when the input signal power is zero.

The output voltage of the amplifier 25 changes in the range of 0 to Vcc as the supply voltage Vcc, depending on the magnitude of the second current I2. For this reason, the allowable input of the amplifier 31 is also demanded to fall in the range of 0 to Vcc.

Thus, in the power detector 23 according to the comparative example, it is difficult to detect input signal power in a wide dynamic range.

In contrast to this, in the power detector 1 according to the first embodiment, the output voltage of the square signal generator 3 is controlled to be almost equal to the reference voltage, which does not change depending on input signal power. Moreover, in the case where the input voltage Input is a sinusoidal wave at a single frequency having a voltage amplitude Vi, the control voltage outputted from the first operational amplifier 18 is proportional to the voltage amplitude Vi of the input voltage Input. Because of this, it is made possible to detect input signal power in a wide dynamic range. Furthermore, because the output voltage of the square signal generator 3 does not change, it is made possible to make a quick response to variations in input signal power. In addition, it is possible to form the power detector 1 using CMOS (Complementary Metal Oxide Semiconductor) transistors and to form it in an integrated circuit by CMOS processing.

Second Embodiment

Figure 3:
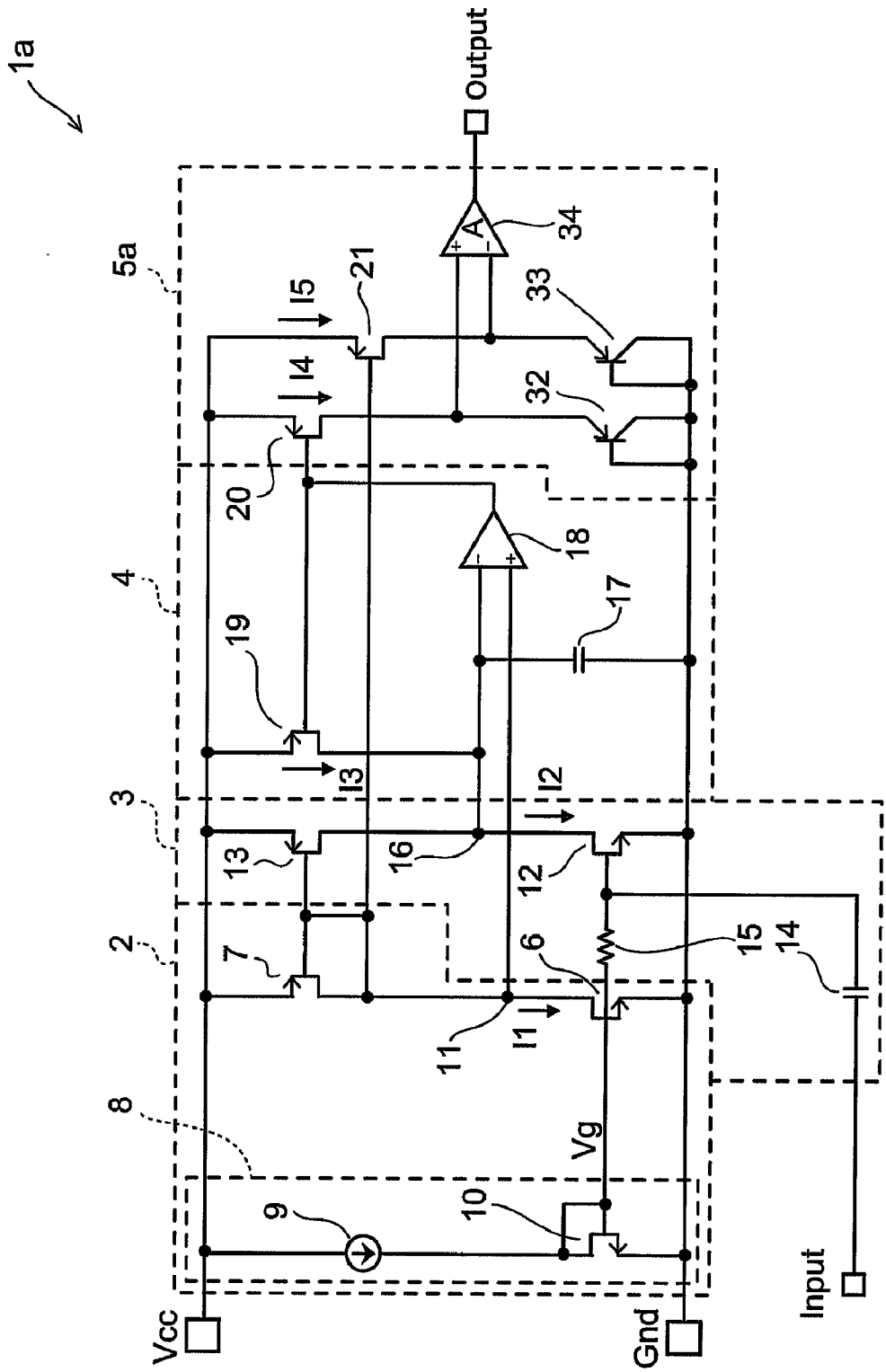
FIG. 3 is a circuit diagram illustrating the configuration of a power detector according to a second embodiment.

FIG. 3 is a circuit diagram illustrating the configuration of a power detector according to a second embodiment.

As illustrated in FIG. 3, a power detector 1a includes a reference voltage generator 2, a square signal generator 3, a detection circuit 4, and an output circuit 5a.

The power detector 1a is configured in such a way that the output circuit 5 of the power detector 1 illustrated in FIG. 1 is replaced by the output circuit 5a. The reference voltage generator 2, the square signal generator 3, and the detection circuit 4 are the same as those in the power detector 1 illustrated in FIG. 1.

The output circuit 5a has a first output transistor 20, a second output transistor 21, a first converter 32, a second converter 33, and a second operational amplifier 34. The output circuit 5a is configured in such a way that the transistor 22 of the output circuit 5 illustrated in FIG. 1 is replaced by the first and second converters 32 and 33 and the second operational amplifier 34. The first and second output transistors 20 and 21 are the same as the first and second output transistors 20 and 21 illustrated in FIG. 1.

The first and second converters 32 and 33 are circuits that respectively receive and convert the current I4 flowing through the first output transistor 20 and the current I5 flowing through the second output transistor 21 into voltages proportional to the logarithm of the current value and output them. In FIG. 3, a pnp bipolar transistor is used for the first and second converters 32 and 33.

In the power detector 1a, the signal passed through the first lowpass filter 17 is inputted to the first and second converters 32 and 33. Because of this, it is unnecessary to use a high speed bipolar transistor in order to form the first and second converters 32 and 33. For a bipolar transistor, a substrate transistor provided as a collector can be used for the semiconductor substrate, for example. Thus, it is possible to integrate the transistor on the same semiconductor substrate as other transistors formed by CMOS micro processing, and it is unnecessary to additionally use is special processing. In addition, it is also possible to use a pn junction diode for the first and second converters 32 and 33.

Here, the case where the first and second converters 32 and 33 are formed of a bipolar transistor will be described.

The first converter 32 is connected between the first output transistor 20 and the ground. The emitter of the first converter 32 is connected to the drain of the first output transistor 20, and the base and collector of the first converter 32 are connected to the ground. The current I4 of the first output transistor 20 proportional to input signal power flows through the first converter 32.

The second converter 33 is connected between the second output transistor 21 and the ground. The emitter of the second converter 33 is connected to the drain of the second output transistor 21, and the base and collector of the second converter 33 is connected to the ground. The current I5 of the second output transistor 21 flows through the second converter 33 as the bias current proportional to the first current I1.

The first and second converters 32 and 33 are used as an emitter-base pn junction diode where the base and the collector are connected to each other. The emitter-base voltage has logarithmic characteristics to the current. Thus, the emitter voltages of the first and second converters 32 and 33 are voltages that the currents I4 and I5 are subjected to logarithmic transformation.

The emitter voltage of the first converter 32 is the value that the input signal power is subjected to logarithmic transformation. The emitter voltage of the second converter 33 is the value that the current I5 proportional to the first current I1 flowing through the first transistor 6 is subjected to logarithmic transformation. The voltage is the voltage that offsets the voltage of the output signal Output when the input signal power is zero.

The second operational amplifier 34 multiplies the differential voltage between the emitter voltages of the first and second converters 32 and 33 by constant, and outputs it as the output signal Output.

In the power detector 1a, the output voltages of the reference voltage generator 2 and the square signal generator 3 do not change depending on input signal power. Moreover, in the case where the input voltage Input is a sinusoidal wave at a single frequency having a voltage amplitude Vi, the control voltage is proportional to the voltage amplitude Vi. Furthermore, it is possible that the power detector 1a detects the input signal power for logarithmic transformation and outputs it. Accordingly, it is made possible to detect input signal power in a much wider dynamic range. In addition, it is possible to integrate the power detector 1a by CMOS processing.

Moreover, a substrate transistor or a pn junction diode is used for logarithmic transformation. Thus, it is made possible to widen a dynamic range as compared with the case of using the region (substhreshold region) of the exponential characteristics to the current and the voltage of MOSFET. Furthermore, it is made possible to increase the response characteristics to a sudden change in input signal power because the individual transistors operate in the saturation region.

Figure 4:
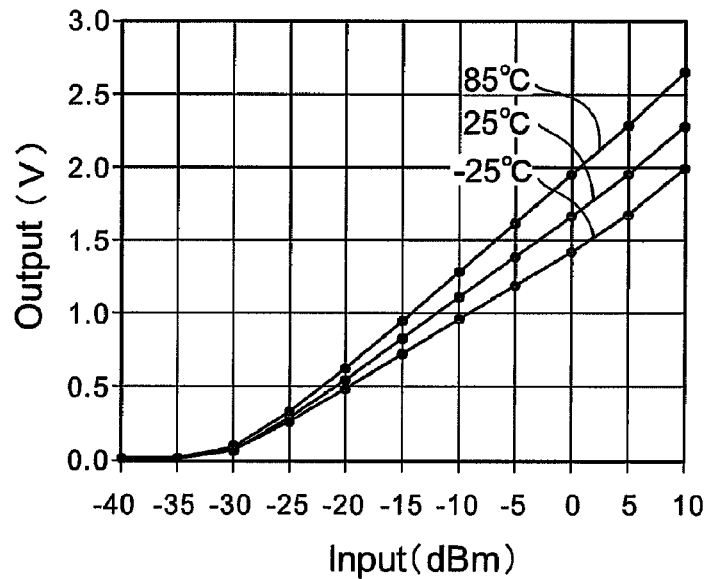
FIG. 4 is a graph illustrating simulation results of the input-output characteristics of the power detector illustrated in FIG. 3.

FIG. 4 is a graph illustrating simulation results of the input-output characteristics of the power detector illustrated in FIG. 3.

In FIG. 4, the input signal power of the input voltage Input is plotted on the horizontal axis in dBm, and the voltage of the output signal Output is plotted on the vertical axis, where the ambient temperature is temperatures of −25° C., 25° C., and 85° C. In addition, the input voltage Input is an unmodulated wave of 2 GHz.

The output voltages, which are subjected to logarithmic transformation, are obtained, where the input signal power of the input voltage Input is in the range of about −30 to 10 dBm.

Figure 5:
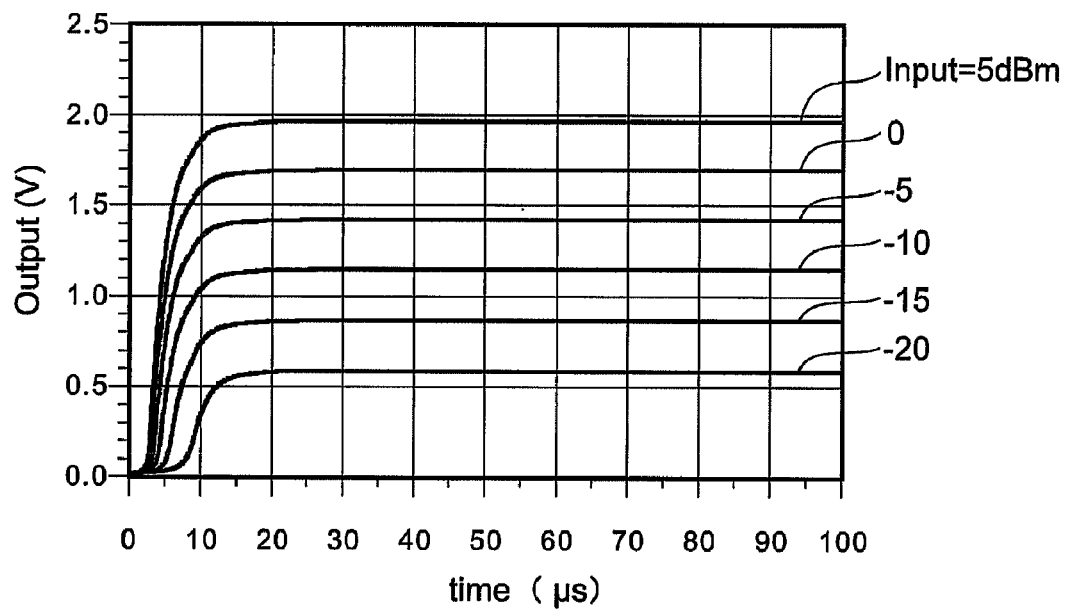
FIG. 5 is a graph illustrating simulation results of time response characteristics of the output of the power detector illustrated in FIG. 3 against changes in input signal power.

FIG. 5 is a graph illustrating simulation results of time response characteristics of the output of the power detector illustrated in FIG. 3 against changes in input signal power.

In FIG. 5, time is plotted on the horizontal axis, and the voltage of the output signal Output is plotted on the vertical axis; the response where the input voltage Input is inputted at time=0 is expressed as the input signal power of the input voltage Input is a parameter.

In the cases where the input signal power of the input voltage Input is 5 dBm, 0 dBm, −5 dBm, −10 dBm, −15 dBm, and −20 dBm, the voltage of the output signal Output is about 15 ms, reaching stationary values.

Third Embodiment

Figure 6:
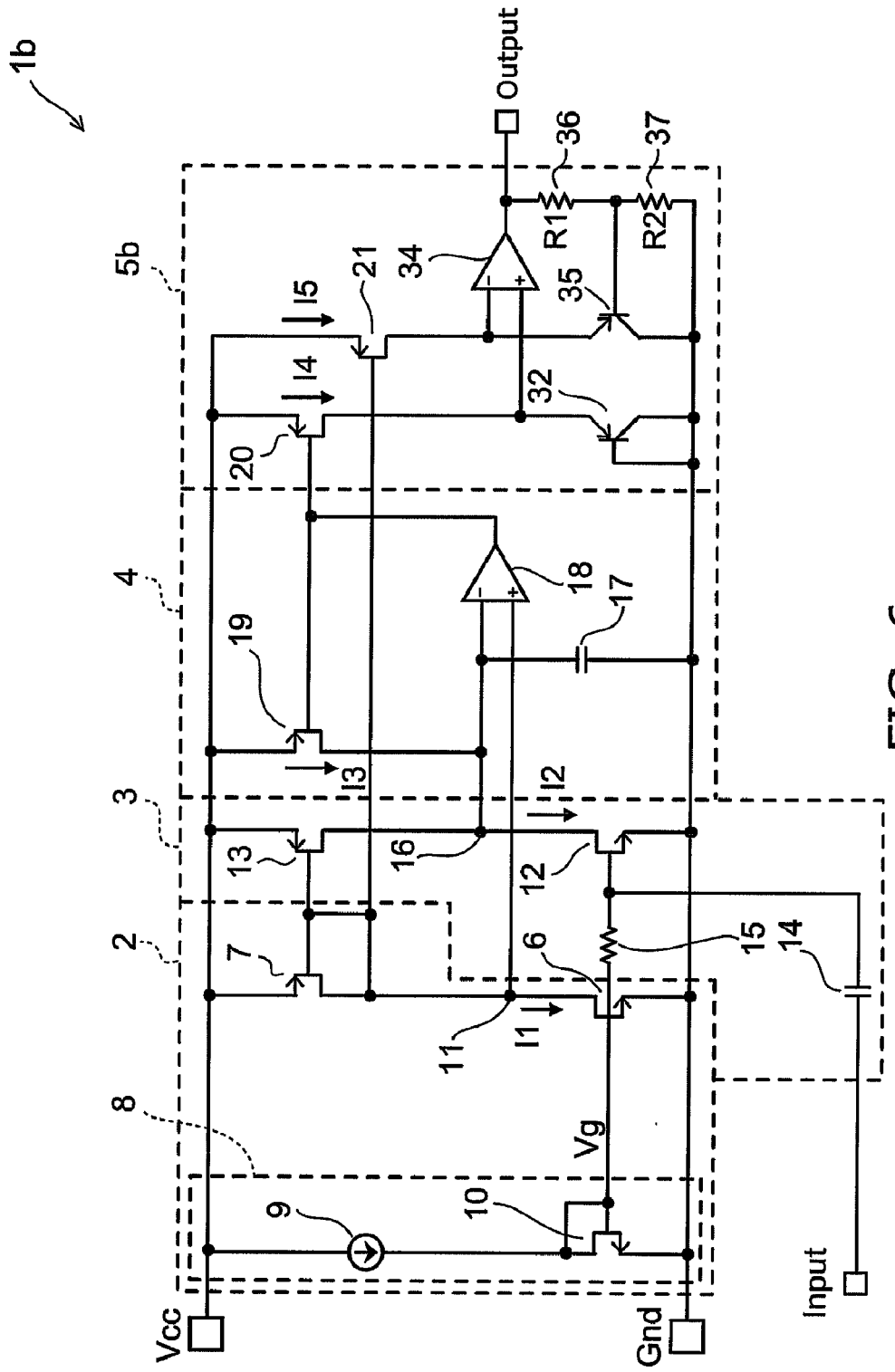
FIG. 6 is a circuit diagram illustrating the configuration of a power detector according to a third embodiment.

FIG. 6 is a circuit diagram illustrating the configuration of a power detector according to a third embodiment.

As illustrated in FIG. 6, a power detector 1b has a reference voltage generator 2, a square signal generator 3, a detection circuit 4, and an output circuit 5b.

The power detector 1b is configured in such a way that the output circuit 5a of the power detector 1a illustrated in FIG. 3 is replaced by the output circuit 5b. The reference voltage generator 2, the square signal generator 3, and the detection circuit 4 are the same as those in the power detector 1a illustrated in FIG. 3.

The output circuit 5b has a first output transistor 20, a second output transistor 21, a first converter 32, a first bipolar transistor (second converter) 35, a second operational amplifier 34, a first resistor 36, and a second resistor 37. The output circuit 5b is configured in such a way that the second converter 33 of the output circuit 5a illustrated in FIG. 3 is formed of the first bipolar transistor 35 and the first and second resistors 36 and 37 are additionally provided.

One end of the first resistor 36 is connected to the output terminal of the second operational amplifier 34, and the other end thereof is connected to the base of the first bipolar transistor (second converter) 35. The second resistor 37 is connected between the other end of the first resistor 36 and the ground. One end of the second resistor 37 is connected to the other end of the first resistor 36 and the base of the first bipolar transistor (second converter) 35, and the other end thereof is connected to the ground.

The first and second resistors 36 and 37 are connected in series, and the output voltage is supplied across each of the first and second resistors 36 and 37. Moreover, the voltage across the second resistor 36 is equal to the base-emitter voltage of the first bipolar transistor (second converter) 35.

Thus, the gain of the second operational amplifier 34 satisfies (1+R1/R2), where the resistances of the first and second resistors 36 and 37 are respectively R1 and R2.

As discussed above, according to the power detector 1b, it is possible to set the gain of the second operational amplifier 34 by the first and second resistors 36 and 37 of the output circuit 5b, and it is possible to implement logarithmic transformation and constant multiplication with a single operational amplifier.

The points other these are the same as those described in the power detector 1a illustrated in FIG. 3, and it is made possible to detect input signal power in a wide dynamic range. In addition, it is possible to form the power detector 1b using CMOS (Complementary Metal Oxide Semiconductor) transistors and to form it in an integrated circuit by CMOS processing.

Fourth Embodiment

Figure 7:
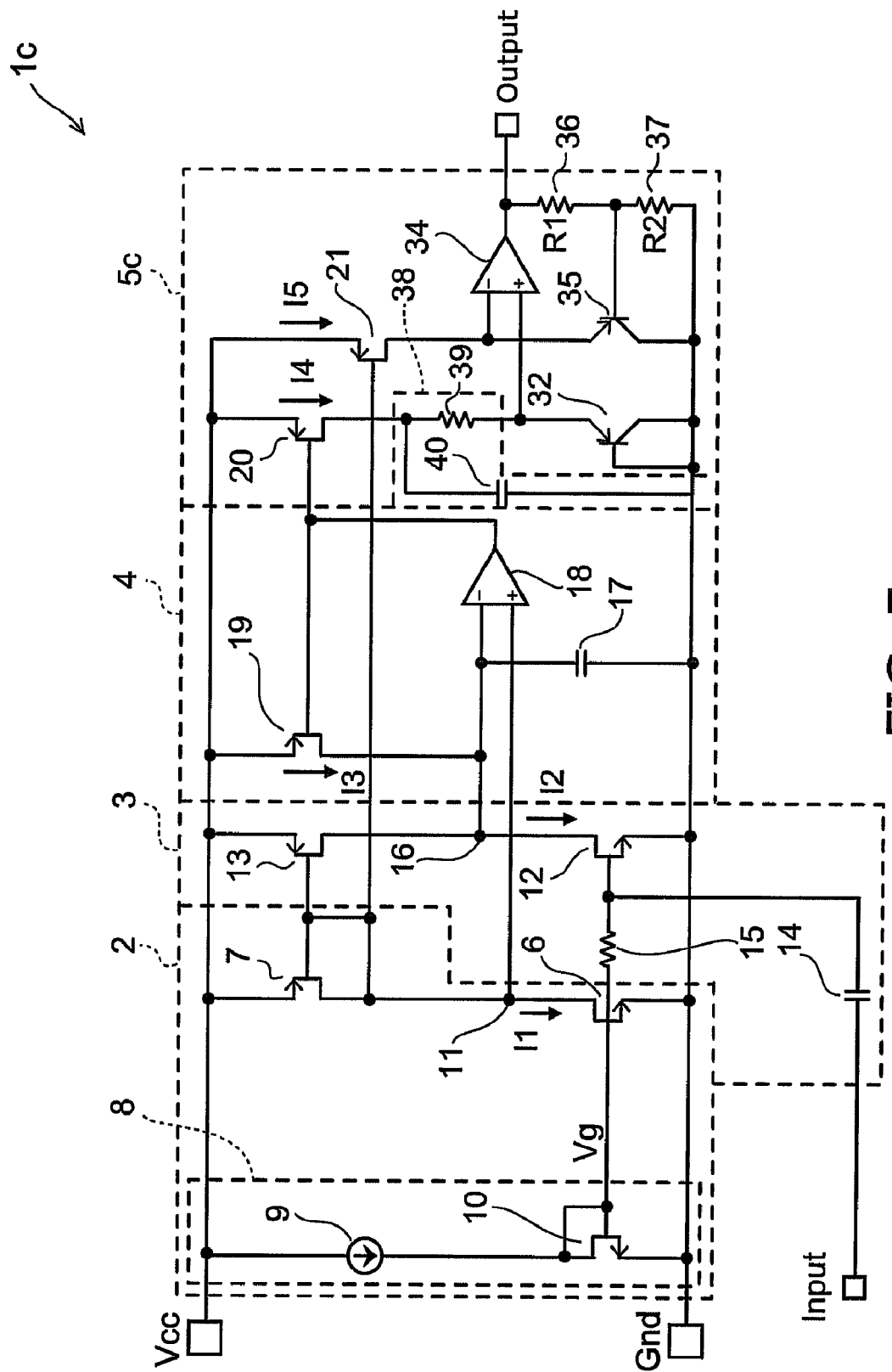
FIG. 7 is a circuit diagram illustrating the configuration of a power detector according to a fourth embodiment.

FIG. 7 is a circuit diagram illustrating the configuration of a power detector according to a fourth embodiment.

As illustrated in FIG. 7, a power detector 1c has a reference voltage generator 2, a square signal generator 3, a detection circuit 4, and an output circuit 5c.

The power detector 1c is configured in such a way that the output circuit 5b of the power detector 1b illustrated in FIG. 6 is replaced by the output circuit 5c. The reference voltage generator 2, the square signal generator 3, and the detection circuit 4 are the same as those in the power detector 1b illustrated in FIG. 6.

The output circuit 5c has a first output transistor 20, a second output transistor 21, a first converter 32, a first bipolar transistor (second converter) 35, a second operational amplifier 34, first and second resistors 36 and 37, and a second lowpass filter 38. The output circuit 5c is configured in such a way that the second lowpass filter 38 is additionally provided in the output circuit 5b illustrated in FIG. 6. The first and second output transistors 20 and 21, the second operational amplifier 34, and the first and second resistors 36 and 37 are the same as those in the output circuit 5b illustrated in FIG. 6.

The second lowpass filter 38 is inserted between the first output transistor 20 and the first converter 32. The second lowpass filter 38 has a resistor 39 and a capacitor 40. The resistor 39 is inserted between the first output transistor 20 and the first converter 32. The capacitor 40 is connected between the drain of the first output transistor 20 and the ground.

The current I4 of the first output transistor 20 proportional to the square mean value of the input voltage Input before logarithmic transformation, i.e., input signal power is passed through the second lowpass filter 38. As a result, it is made possible to output the mean value for the power that is fluctuating. For example, the cutoff frequency of the second lowpass filter 38 is set lower than the cutoff frequency of the first the lowpass filter 17, or the cutoff frequency of the second lowpass filter 38 is set to a frequency that filters the frequency of power fluctuations to average power fluctuations, so that it is possible to obtain the output near the detected root-mean-square value.

Fifth Embodiment

Figure 8:
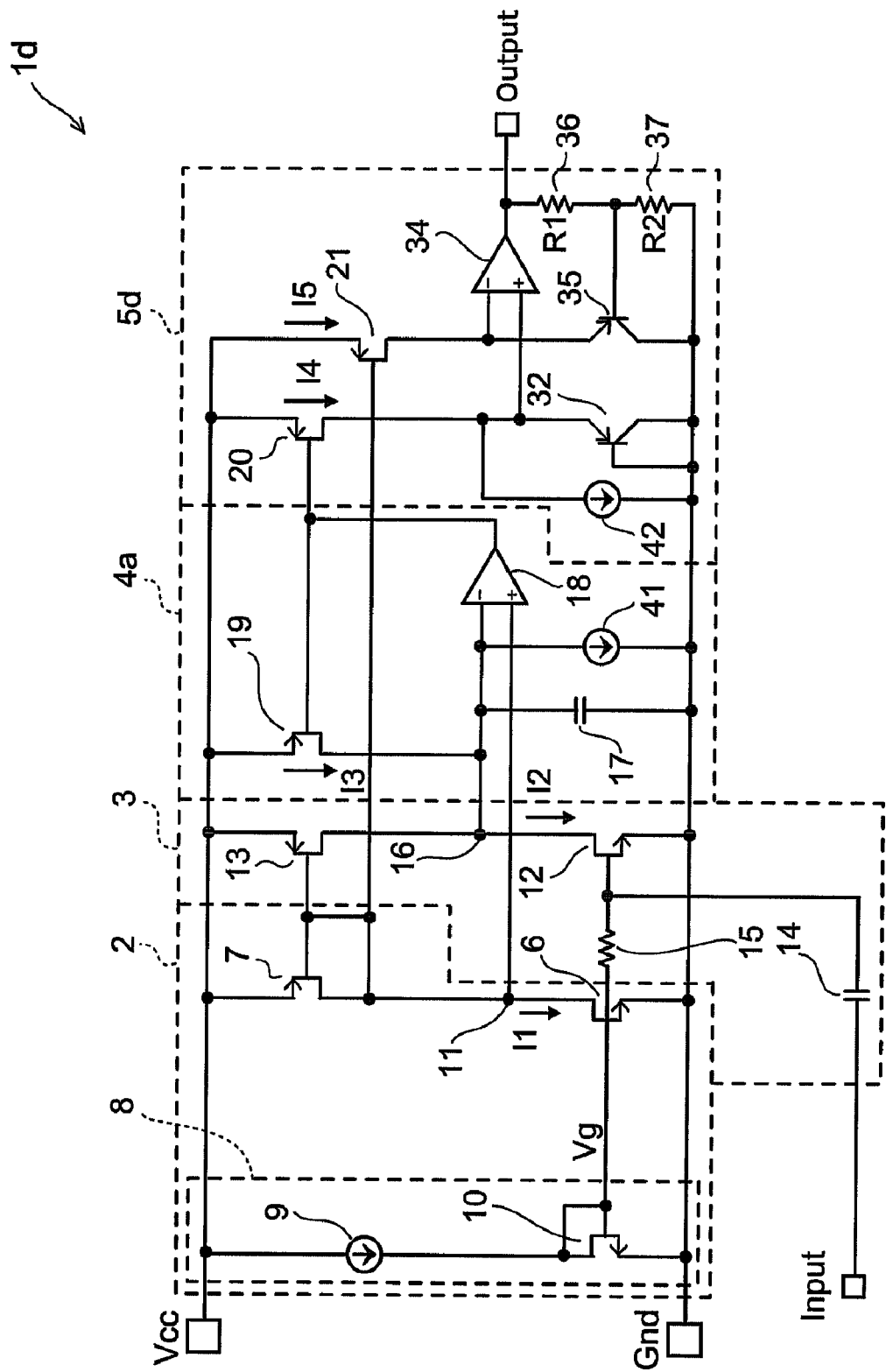
FIG. 8 is a circuit diagram illustrating the configuration of a power detector according to a fifth embodiment.

FIG. 8 is a circuit diagram illustrating the configuration of a power detector according to a fifth embodiment.

As illustrated in FIG. 8, a power detector 1d has a reference voltage generator 2, a square signal generator 3, a detection circuit 4a, and an output circuit 5d.

The power detector 1d is configured in such a way that the detection circuit 4 and the output circuit 5b of the power detector 1b illustrated in FIG. 6 are replaced by the detection circuit 4a and the output circuit 5d, respectively. The reference voltage generator 2 and the square signal generator 3 are the same as those in the power detector 1b illustrated in FIG. 6.

The detection circuit 4a has a first lowpass filter 17, a first operational amplifier 18, a feedback transistor 19, and a first current generator 41. The detection circuit 4a is configured in such a way that the first current generator 41 is additionally provided in the detection circuit 4 illustrated in FIG. 6. The first lowpass filter 17, the first operational amplifier 18, and the feedback transistor 19 are the same as those in the detection circuit 4 illustrated in FIG. 6.

The first current generator 41 is connected between the inverting input terminal of the first operational amplifier 18 and the ground, and takes in a part of the feedback current I3 flowing through the feedback transistor 19.

The output circuit 5d has a first output transistor 20, a second output transistor 21, a first converter 32, a first bipolar transistor (second converter) 35, a second operational amplifier 34, first and second resistors 36 and 37, a second lowpass filter 38, and a second current generator 42. The output circuit 5d is configured in such a way that the second current generator 42 is additionally provided in the output circuit 5b illustrated in FIG. 6. The first and second output transistors 20 and 21, the first converter 32, the first bipolar transistor (second converter) 35, the second operational amplifier 34, and the first and second resistors 36 and 37 are the same as those in the output circuit 5b illustrated in FIG. 6.

The second current generator 42 is connected between the drain of the first output transistor 20 and the ground, and takes in a part of the current of the first output transistor 20, which flows through the first output transistor 20.

The current ratio N:M (N, M>0) between the first and second current generators 41 and 42 is set equal to the current ratio N:M between the feedback transistor 19 and the first output transistor 20.

When the input signal power of the input voltage Input is small, the feedback current I3 does not flow through the feedback transistor 19 and the current I4 of the first output transistor 20 does not flow through the first output transistor 20. Because of this, the feedback transistor 19 and the first output transistor 20 are put in the off-state until the input signal power grows sufficiently enough, so that the square low characteristics are not obtained for the control voltage.

In the power detector 1d, a constant current is drawn from the feedback transistor 19 and the first output transistor 20 by the first and second current generators 41 and 42. As a result, it is possible to stabilize a bias under low input conditions where input signal power is low, and to extend detectable input signal power to the low power side. It is made possible to detect input signal power in a wide dynamic range. In addition, it is made possible to improve the responsiveness to a sudden power change in the input-output characteristics.

Sixth Embodiment

Figure 9:
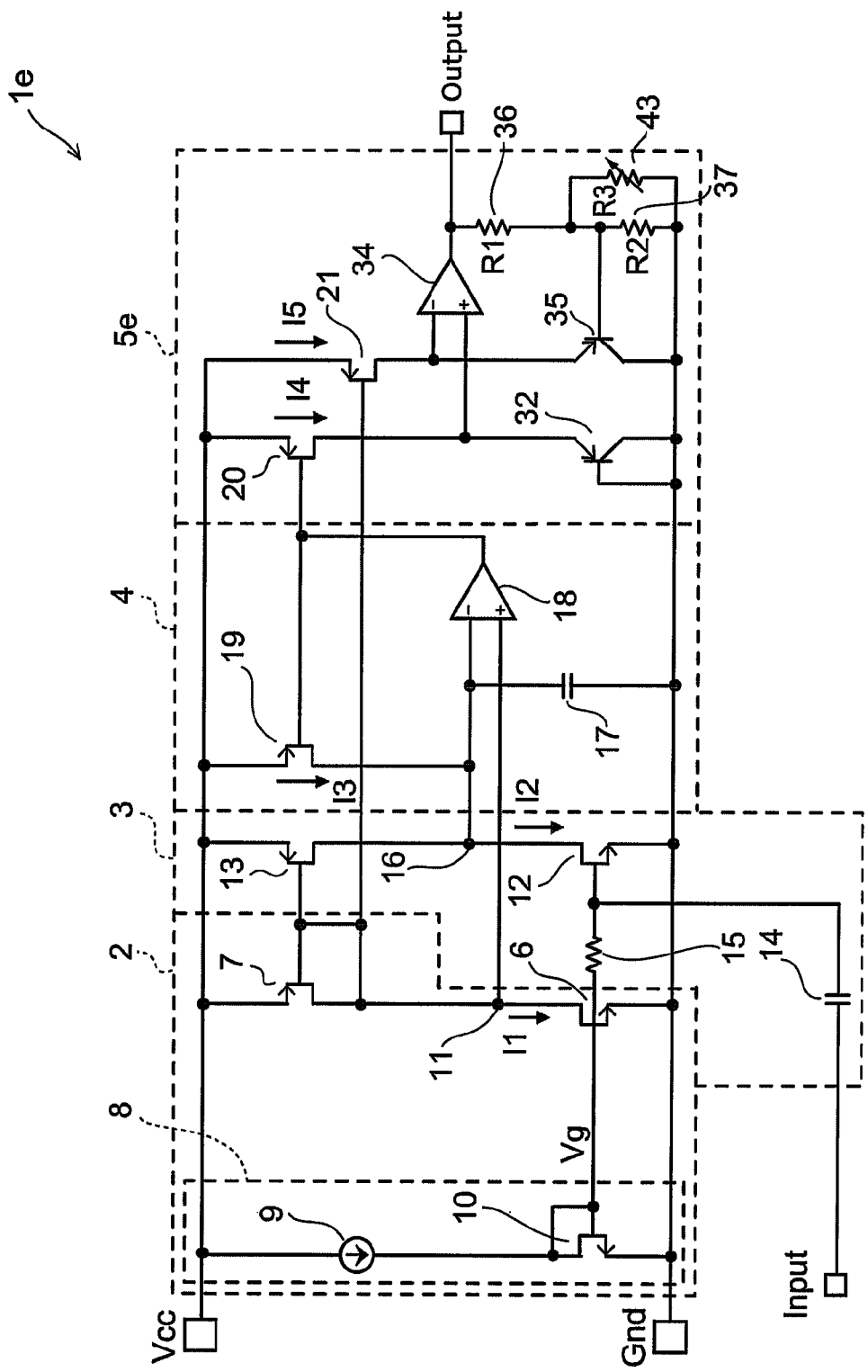
FIG. 9 is a circuit diagram illustrating the configuration of a power detector according to a sixth embodiment.

FIG. 9 is a circuit diagram illustrating the configuration of a power detector according to a sixth embodiment.

As illustrated in FIG. 9, a power detector 1e has a reference voltage generator 2, a square signal generator 3, a detection circuit 4, and an output circuit 5e.

The power detector 1e is configured in such a way that the output circuit 5b of the power detector 1b illustrated in FIG. 6 is replaced by the output circuit 5e. The reference voltage generator 2, the square signal generator 3, and the detection circuit 4 are the same as those in the power detector 1b illustrated in FIG. 6.

The output circuit 5e has a first output transistor 20, a second output transistor 21, a first converter 32, a first bipolar transistor (second converter) 35, a second operational amplifier 34, a first resistor 36, a second resistor 37, and a third resistor 43. The output circuit 5e is configured in such a way that the third resistor 43 is additionally provided in the output circuit 5b illustrated in FIG. 6. The points other these are the same as those described in the output circuit 5b illustrated in FIG. 6.

The third resistor 43 is connected between the other end of the first resistor 36 and the ground in parallel with the second resistor 37. The third resistor 43 is a variable resistor, and allows the gain of the second operational amplifier 34 to vary by changing a resistance R3. Moreover, the temperature characteristics are provided in the resistance of the third resistor 43, so that it is possible to compensate the temperature dependent characteristics produced in the reference voltage generator 2, the square signal generator 3, and the detection circuit 4. Thus, it is made possible to cancel the temperature dependent characteristics of the output voltage of the output signal Output of the power detector 1e.

In FIG. 9, an exemplary configuration is illustrated for the output circuit 5e in which the third resistor 43 is connected in parallel with the second resistor 37 to cause the resistance to be variable. However, it is may be possible that the base voltage of the first bipolar transistor (second converter) 35 is changed and the division ratio at the connection point between the first and second resistors 36 and 37 is changed. Thus, it is also possible to change the resistance of the first resistor 36 or the resistance of the second resistor 37.

First Example of Sixth Embodiment

Figure 10:
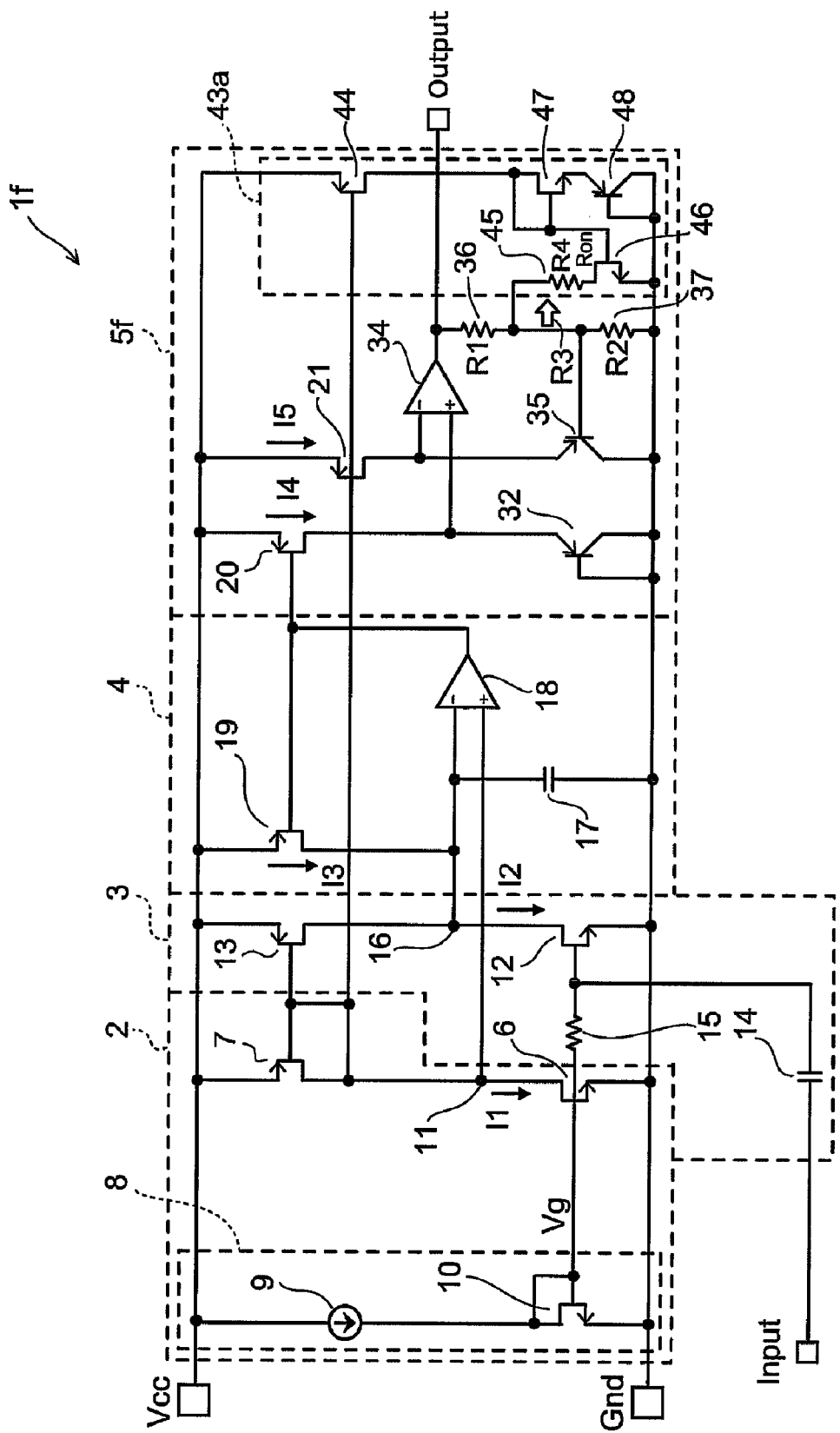
FIG. 10 is another circuit diagram illustrating the configuration of the power detector according to the sixth embodiment.

It is possible to configure the third resistor 43 as illustrated in FIG. 10, for example.

In FIG. 10, an exemplary configuration of a power detector 1f is illustrated in which a third resistor 43a is used for an output circuit 5f.

The third resistor 43a has transistors 44 and 47, a transistor (variable resistor) 46, a resistor 45, and a first voltage generator 48.

The transistor 44 is a PMOS, and the gate is connected to the drain of the first load circuit 7. The supply voltage Vcc is supplied to the source of the transistor 44. The transistor 44 forms a current mirror with the first load circuit 7 as similar to the second load circuit 13.

Thus, a current proportional to the first current I1 flowing through the first load circuit 7 flows through the drain of the transistor 44 as a bias current.

One end of the resistor 45 is connected to the connection point between the first and second resistors 36 and 37, and the transistor 46 is connected between the other end thereof and the ground. The transistor 46 is an NMOS.

The gate of the transistor 46 is connected to the gate and drain of the transistor 47 and to the drain of the transistor 44. The transistor 47 is an NMOS. The first voltage generator 48 is connected between the source and ground of the transistor 47.

The first voltage generator 48 is formed of a pnp bipolar transistor, and the base and the collector are connected to the ground. For the bipolar transistor of the first voltage generator 48, it is possible to use a substrate transistor in which a collector is provided on a semiconductor substrate, for example. In addition, it may be a pn junction diode.

The transistor 46 is used for a variable resistor. The bias voltage that sets the resistance of the transistor 46 is generated at the transistors 44 and 47 and the first voltage generator 48. As described above, a bias current flows from the transistor 44 to the transistor 47 and the first voltage generator 48.

Consequently, a voltage having the temperature characteristics of the base-emitter voltage of the first voltage generator 48 is supplied to the gate of the transistor 46. Thus, it is possible to provide the temperature characteristics to the resistance of the transistor 46. Moreover, it is possible to select the size of the transistor 46 to obtain a desired amount of the variable resistance, and it is made possible to cancel the temperature dependence produced in the reference voltage generator 2, the square signal generator 3, the detection circuit 4, and the output circuit 5f in the previous stage.

Figure 11:
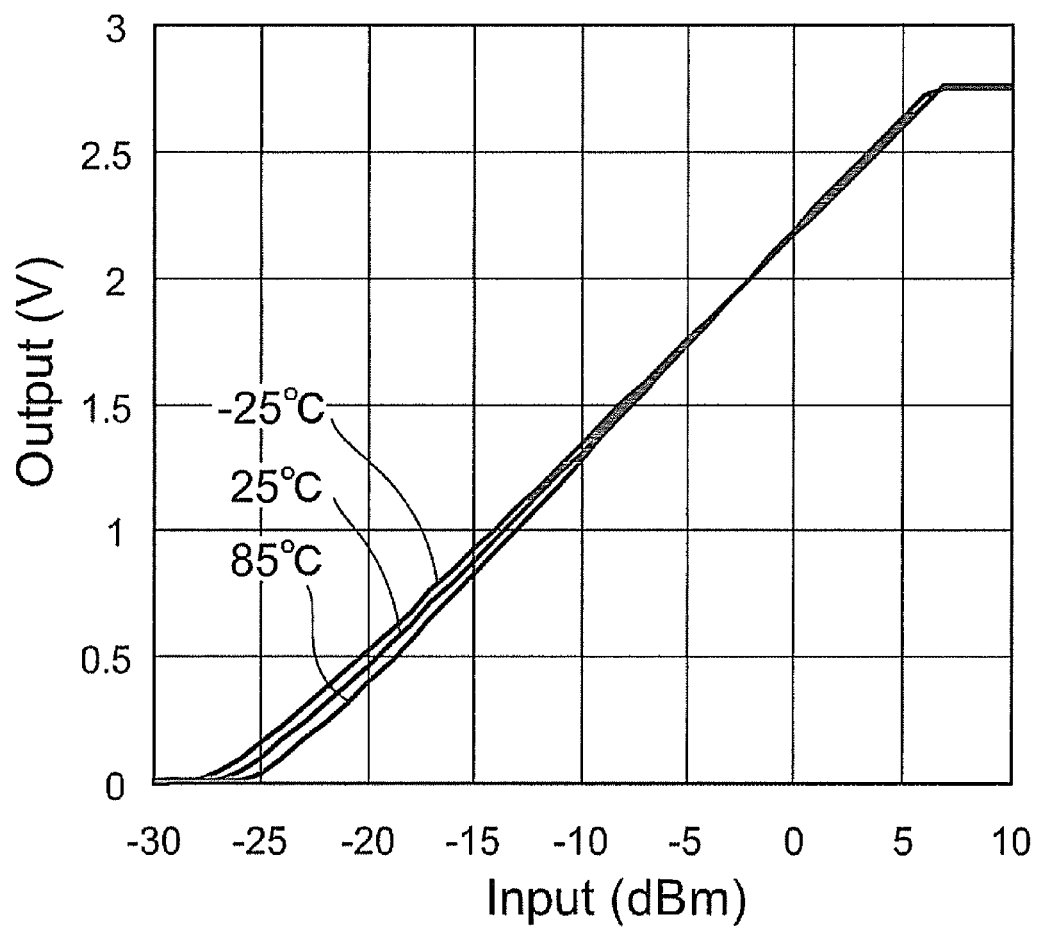
FIG. 11 is a graph illustrating simulation results of the input-output characteristics of the power detector illustrated in FIG. 10.

FIG. 11 is a graph illustrating simulation results of the input-output characteristics of the power detector 1f illustrated in FIG. 10.

In FIG. 11, the input signal power of the input voltage Input is plotted on the horizontal axis in dBm, and the voltage of the output signal Output is plotted on the vertical axis, where the ambient temperature is temperatures of −25° C., 25° C., and 85° C.

As compared with the case illustrated in FIG. 4 where the temperature is not compensated, it is shown that changes in the input-output characteristics against changes in the ambient temperature are reduced.

Suppose that the current flowing through the first output transistor 20 is I4, and the current flowing through the second output transistor 21 is I5. In addition, suppose that the resistance of the first resistor 36 is R1, the resistance of the second resistor 37 is R2, the resistance of the third resistor 43a is R3, the resistance of the resistor 45 is R4, and the on resistance of the transistor 46 is Ron. The resistance of the third resistor 43a is R3=R4+Ron. The voltage of the output signal Output is given by Equation (1).

$$\text{Output} = (1 + R1(R2 + R4 + \text{Ron})/(R2(R4 + \text{Ron}))) \times Vt \times \ln(I4/I5) \quad (1)$$

Here, Vt is a thermal voltage, which is proportional to the absolute temperature. The reverse saturation currents of the first converter 32 and the first bipolar transistor (second converter) 35 are ignored.

Thus, the temperature characteristics of the thermal voltage Vt are compensated by the temperature characteristics of the combined resistance of the resistances of the first to third resistors 36, 37, and 43a, so that it is possible to suppress the temperature dependence of the output signal Output.

Therefore, it is necessary to match the individual resistances in such a way that the temperature characteristics of the combined resistance of the resistances of the first to third resistors 36, 37, and 43a cancel the temperature dependence of the first converter 32 and the first bipolar transistor (second converter) 35 formed of bipolar transistors. However, when the ratio of the individual resistances to the on resistance Ron of the transistor 46 of the third resistor 43a is changed due to variations in production or the like, the above-mentioned compensation effect is decreased.

Figure 12A:
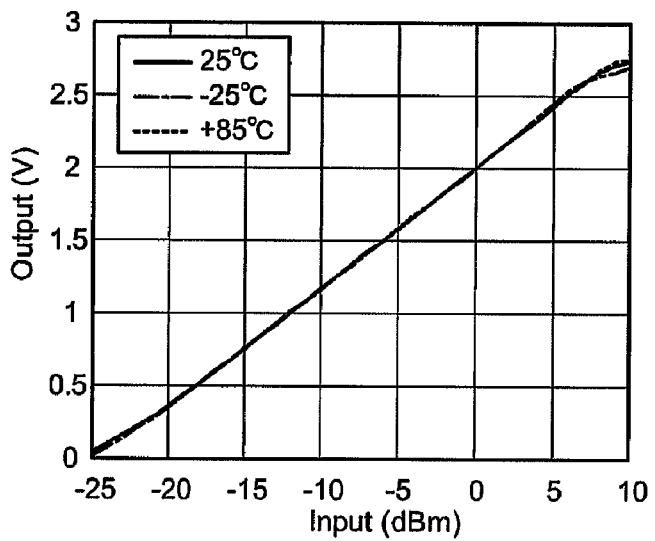
FIGS. 12A to 12C are graphs illustrating simulation results of the input-output characteristics of the power detector illustrated in FIG. 10, and FIGS. 12A, 12B, and 12C show the cases where there are resistance changes at 0, −20%, and 20%, respectively.
Figure 12B:
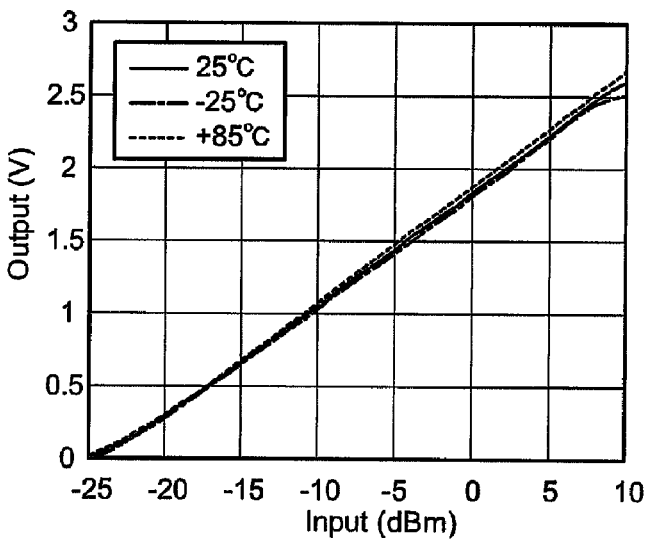
Figure 12C:
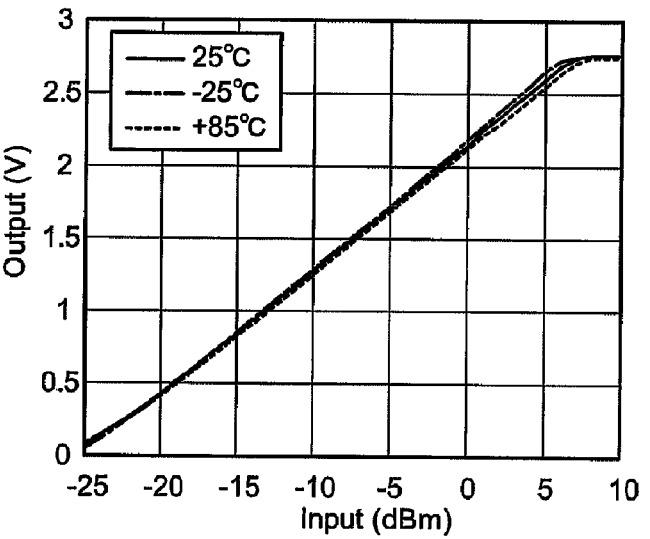

FIGS. 12A to 12C are graphs illustrating simulation results of the input-output characteristics of the power detector 1f illustrated in FIG. 10, and FIGS. 12A, 12B, and 12C show the cases where there are resistance changes at 0, −20%, and 20%, respectively.

In FIGS. 12A to 12C, the input signal power of the input voltage Input is plotted on the horizontal axis in dBm, and the voltage of the output signal Output is plotted on the vertical axis, where the ambient temperature is temperatures of −25° C., 25° C., and 85° C.

Figure 13A:
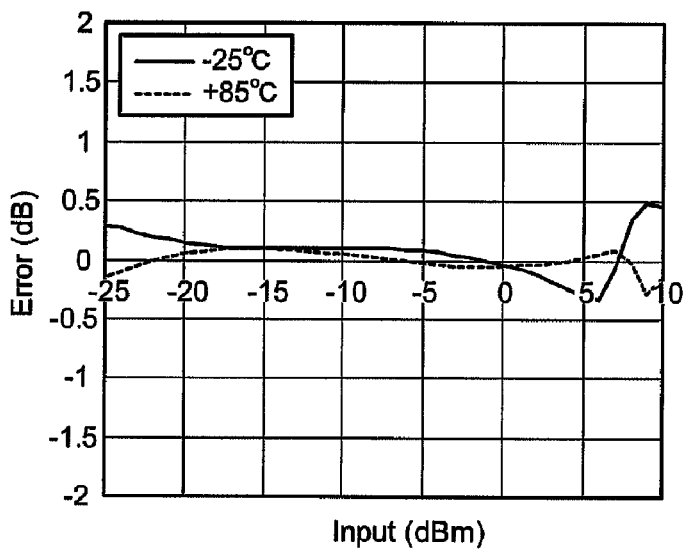
FIGS. 13A to 13C are graphs illustrating the relative error to the input-output characteristics illustrated in FIGS. 12A to 12C at a temperature of 25° C.
Figure 13B:
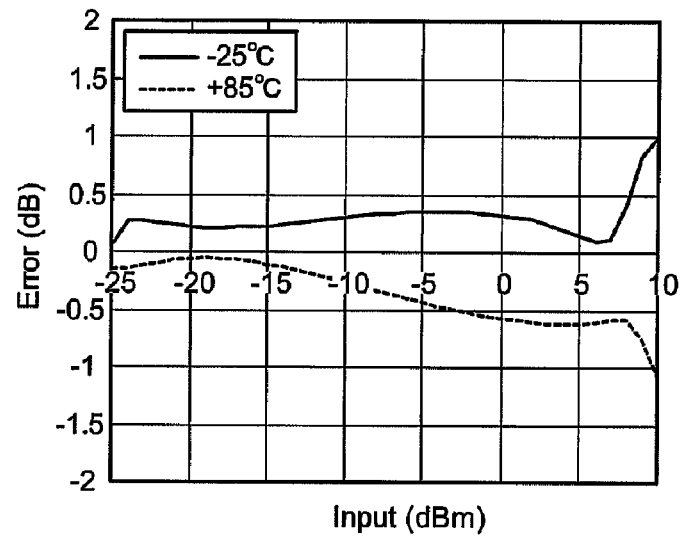
Figure 13C:
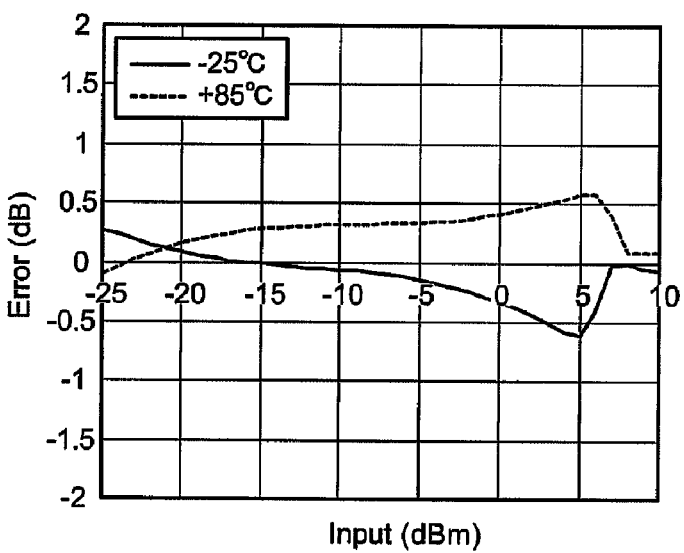

FIGS. 13A to 13C are graphs illustrating the relative error to the input-output characteristics illustrated in FIG. 12 at a temperature of 25° C., and FIGS. 13A, 13B, and 13C show the cases where there are resistance changes at 0%, −20%, and 20%, respectively.

In FIGS. 13A to 13C, the input signal power of the input voltage Input is plotted on the horizontal axis in dBm, and the relative error to the input-output characteristics at a temperature of 25° C. is expressed in dB, where the ambient temperature is temperatures of −25° C. and 85° C.

As illustrated in FIGS. 12A and 13A, in the case where the individual resistances are as design values and the resistance change is at 0%, the temperature characteristics of the output signal Output are compensated where the input signal power of the input signal Input is in the range of about −25 to 10 dBm.

As illustrated in FIGS. 12B and 13B, in the case where the individual resistances are changed against the design value by −20%, the temperature dependence of the output signal Output increases, and the temperature compensation is shifted. In addition, as illustrated in FIGS. 12C and 13C, also in the case where the individual resistances are changed against the design values by +20%, the temperature dependence of the output signal Output increases, and the temperature compensation is shifted.

Because variations in the on resistance Ron of the transistor 46 due to manufacturing processes or the like are smaller than variations in the first and second resistors 36 and 37 and the resistor 45, the ratio of the individual resistances to the on resistance Ron of the transistor 46 is shifted from the design value, and consequently, the temperature compensation is shifted.

Seventh Embodiment

Figure 14:
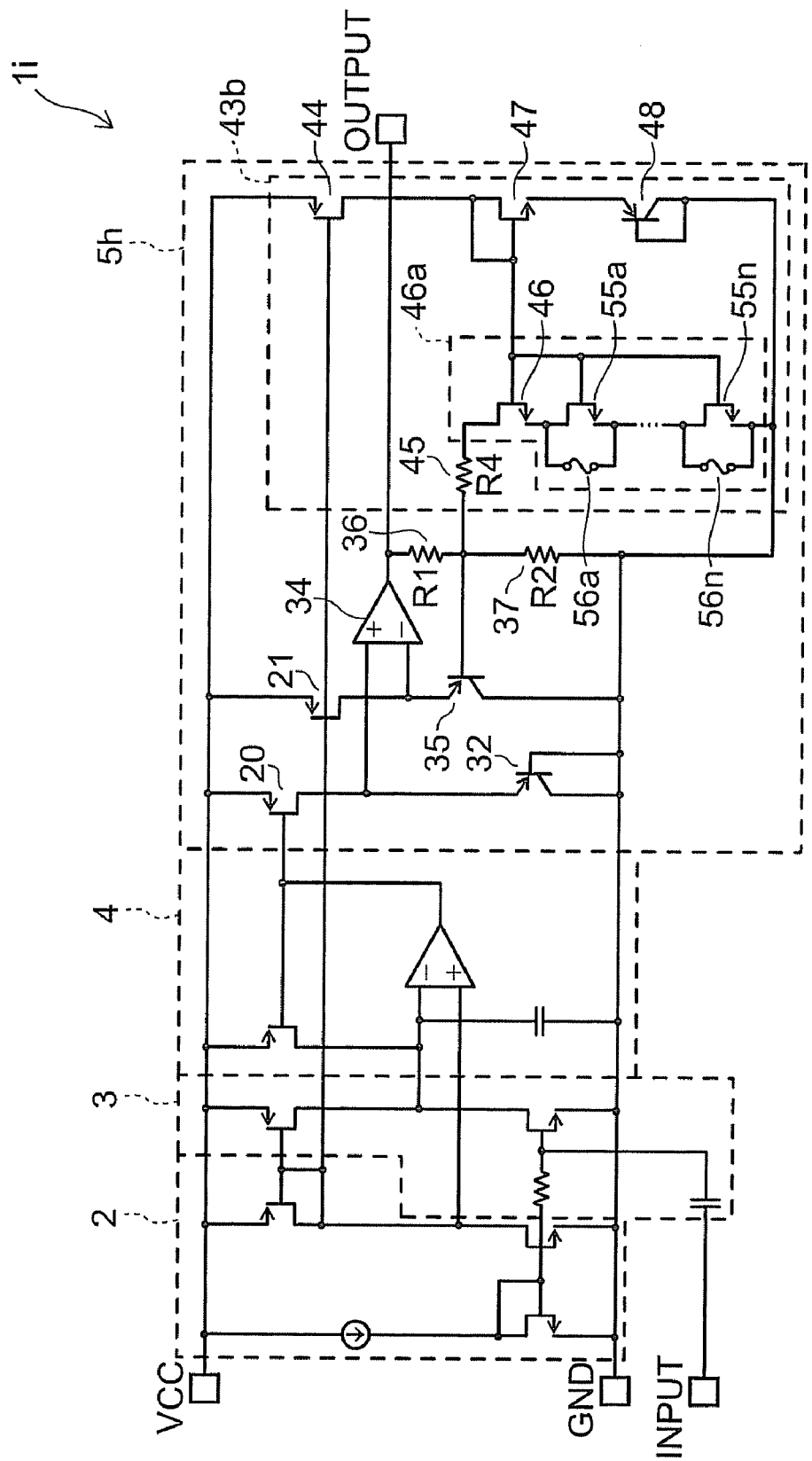
FIG. 14 is a circuit diagram illustrating the configuration of a power detector according to a seventh embodiment.

FIG. 14 is a circuit diagram illustrating the configuration of a power detector according to a seventh embodiment.

In FIG. 14, an exemplary configuration of a power detector 1$i$ using an output circuit 5$h$ is illustrated. A reference voltage generator 2, a square signal generator 3, and a detection circuit 4 are the same as those in the power detector 1 illustrated in FIG. 1. The output circuit 5$h$ is configured in such a way that the third resistor 43$a$ of the output circuit 5$f$ of the power detector 1$f$ illustrated in FIG. 10 is replaced by a third resistor 43$b$. In addition, for the reference numerals of the individual components of the reference voltage generator 2, the square signal generator 3, and the detection circuit 4, descriptions are omitted.

The third resistor 43$b$ has transistors 44 and 47, a resistor 45, a variable resistor 46$a$, and a first voltage generator 48.

The third resistor 43$b$ is configured in such a way that the transistor 46 illustrated in FIG. 10 is replaced by the variable resistor 46$a$. The variable resistor 46$a$ is configured in such a way that the transistor 46 additionally includes third output transistors 55$a$ to 55$n$ in n stages (n is a natural number), and output fuse circuits 56$a$ to 56$n$ in n stages.

The transistor 46 and the third output transistors 55$a$ to 55$n$ are formed of an NMOS. In FIG. 14, two of the third output transistors 55$a$ and 55$n$ and two of the output fuse circuits 56$a$ and 56$n$ are illustrated in the drawing. However, it is possible to set the stage number n of the output transistor and the output fuse circuit to a given number. In addition, it is possible to set the on resistance of each of the third output transistors 55$a$ to 55$n$ to a value weighted with 2 to the m-th power (m is a natural number of n or less).

A bias voltage is inputted to the gate of each of the transistor 46 and the third output transistors 55$a$ to 55$n$. The bias voltage is generated at the transistors 44 and 47 and the first voltage generator 48, as similar to the output circuit 5$f$ of the power detector 1$f$ illustrated in FIG. 10. Thus, the bias voltage has the temperature characteristics of the base-emitter voltage of the first voltage generator 48. The on resistance of each of the transistor 46 and the third output transistors 55$a$ to 55$n$ also has the temperature characteristics.

The third output transistors 55$a$ to 55$n$ are connected in series between the transistor 46 and the ground Gnd.

The output fuse circuits 56$a$ and 56$n$ are respectively connected to the third output transistors 55$a$ and 55$n$ in parallel. The output fuse circuit 56$a$ is connected to the drain and source of the third output transistor 55$a$. The output fuse circuit 56$n$ is connected to the drain and source of the third output transistor 55$n$. The same things are applied to the other third output transistors and output fuse circuits, not shown in the drawing.

It is possible to arbitrarily set the value of the on resistance Ron of the variable resistor 46$a$ by individually disconnecting the output fuse circuits 56$a$ to 56$n$.

As a result, even in the case where the ratio of the value of the on resistance of the variable resistor 46$a$ to each of the individual resistances of the first to third resistors 36, 37, and 43$b$ is changed due to variations in production or the like, it is made possible that the value of the on resistance of the variable resistor 46$a$ is adjusted to eliminate the influence of variations in production for compensating the temperature characteristics.

Next, a setting method for the value of the on resistance of the variable resistor will be described, where the case is taken as an example in which the output fuse circuit and the third output transistor are each formed in two stages.

Figure 15:
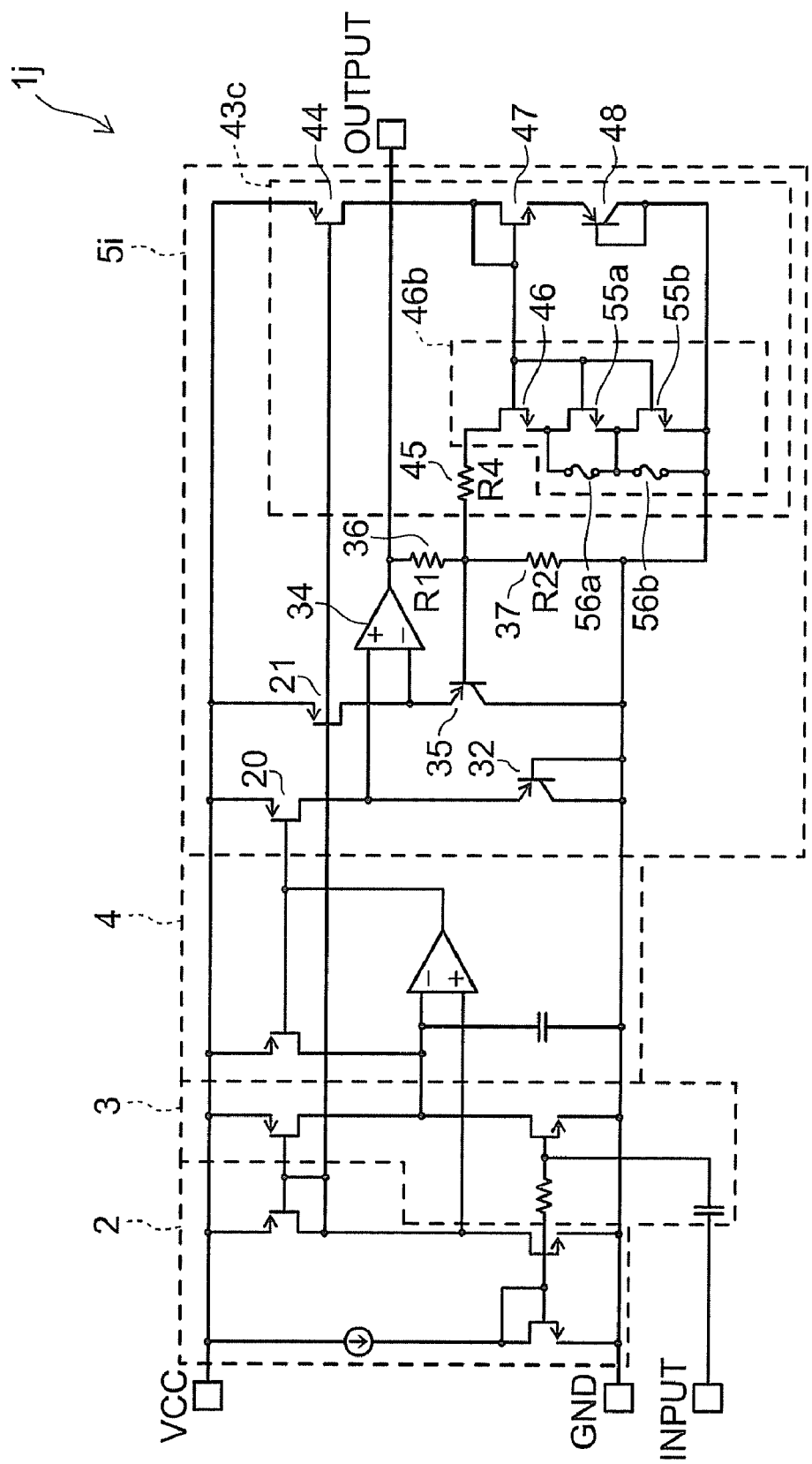
FIG. 15 is another circuit diagram illustrating the configuration of the power detector according to the seventh embodiment.

FIG. 15 is another circuit diagram illustrating the configuration of the power detector according to the seventh embodiment.

As illustrated in FIG. 15, a power detector 1$j$ uses an output circuit 5$i$ in which the third resistor 43$b$ of the output circuit 5$h$ of the power detector 1$i$ illustrated in FIG. 14 is replaced by a third resistor 43$c$. In addition, for the reference numerals of the individual components of a reference voltage generator 2, a square signal generator 3, and a detection circuit 4, descriptions are omitted.

The third resistor 43$c$ is configured in such a way that the variable resistor 46$a$ of the third resistor 43$b$ illustrated in FIG. 14 is replaced by a variable resistor 46$b$. The variable resistor 46$b$ additionally includes third output transistors 55$a$ and 55$b$ in two stages and output fuse circuits 56$a$ and 56$b$ in two stages in the transistor 46.

The transistor 46 and the third output transistors 55$a$ and 55$b$ are formed of an NMOS.

A bias voltage with the above-mentioned temperature characteristics is inputted to the gate of each of the transistor 46 and the third output transistors 55$a$ and 55$b$. The on resistance Ron of the variable resistor 46$b$ also has the temperature characteristics.

The third output transistors 55$a$ and 55$b$ are connected in series between the transistor 46 and the ground Gnd.

The output fuse circuits 56$a$ and 56$b$ are connected to the third output transistors 55$a$ and 56$b$ in parallel. The output fuse circuit 56$a$ is connected to the drain and source of the third output transistor 55$a$. The output fuse circuit 56$b$ is connected to the drain and source of the third output transistor 55$b$.

It is possible to adjust the value of the on resistance Ron of the variable resistor 46$b$ by individually disconnecting the output fuse circuits 56$a$ and 56$b$.

Figures 16A, 16B:
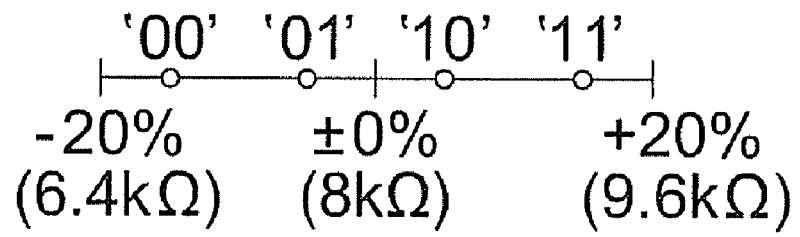
FIGS. 16A and 16B are schematic views illustrating the relationship between the output fuse circuit disconnecting value and the on resistance in the power detector illustrated in FIG. 15.

FIGS. 16A and 16B are schematic views illustrating the relationship between the output fuse circuit disconnecting value and the on resistance in the power detector illustrated in FIG. 15; FIG. 16A is illustrated in a table, and FIG. 16B is illustrated in lines.

FIGS. 16A and 16B illustrate exemplary numeric values where the design value of the on resistance Ron of the variable resistor 46$b$ is 8 kΩ, and variations due to manufacturing processes or the like are in the range of ±20% (6.4 to 9.4 kΩ). The on resistances of the transistor 46 and the third output transistors 55$a$ and 55$b$ are respectively 6.8 kΩ, 1.6 kΩ, and 0.8 kΩ. The state in which the output fuse circuits 56$a$ and 56$b$ are disconnected is expressed by '1', and the state in which they are not disconnected is expressed by '0'. It is possible to change the value of the on resistance Ron in four steps around the design value The output fuse circuits 56a and 56b are disconnected in such a way that the resistance of the first resistor 36, whose value is changed due to manufacturing processes or the like, is measured to calculate an amount of a shift from the design value for providing the optimum value of the on resistance matching with the amount of a shift.

In addition, it is also possible to separately provide a resistor that measures variations in manufacturing processes for measuring its resistance. The case is explained where the output fuse circuits 56a and 56b are formed in two stages. However, also in the case where they are formed in n stages (n is a natural number), it is possible to provide the optimum value of the on resistance by disconnecting the output fuse circuit.

As discussed above, according to the power detectors 1i and 1j, even in the case where the ratio of the individual resistances of the first to third resistors 36, 37, 43b, and 43c to the values of the on resistance of the variable resistors 46a and 46b is changed due to variations in production or the like, it is possible to adjust the values of the on resistance of the variable resistors 46a and 46b to the optimum value. Thus, it is made possible to eliminate the influence of variations in production for compensating the temperature characteristics.

In addition, also in the power detectors 1i and 1j, the configurations of the reference voltage generator 2, the square signal generator 3, the detection circuit 4, and so on are the same as those in the above-mentioned power detectors, and it is made possible to detect the input signal in a wide dynamic range. In addition, it is made possible to improve the responsiveness to a sudden power change in the input-output characteristics.

Figure 17:
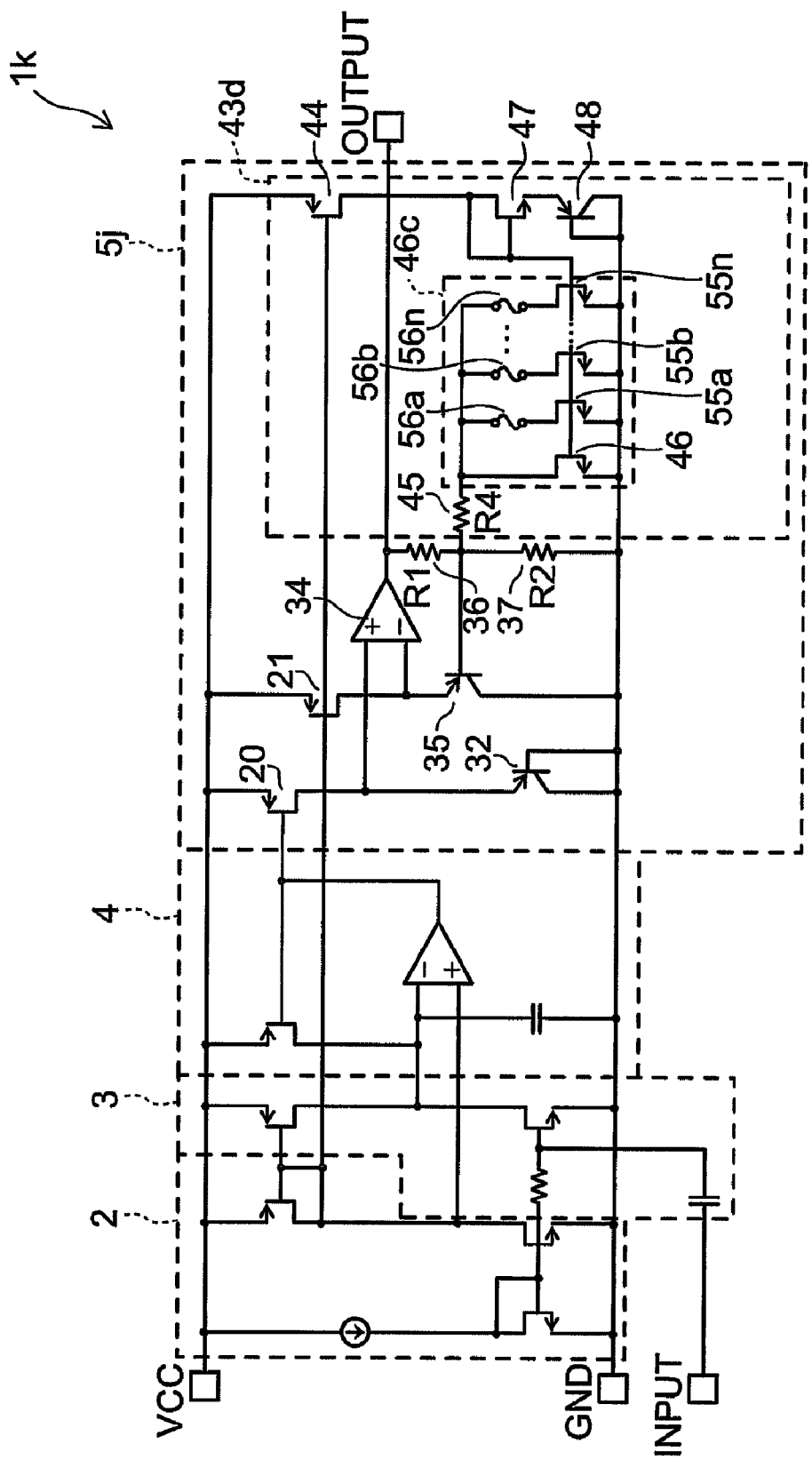
FIG. 17 is still another circuit diagram illustrating the configuration of the power detector according to the seventh embodiment.

FIG. 17 is still another circuit diagram illustrating the configuration of the power detector according to the seventh embodiment.

As illustrated in FIG. 17, a power detector 1k uses an output circuit 5j in which the third resistor 43b of the output circuit 5h of the power detector 1i illustrated in FIG. 14 is replaced by a third resistor 43d. In addition, for the reference numerals of the individual components of a reference voltage generator 2, a square signal generator 3, and a detection circuit 4, descriptions are omitted.

The third resistor 43d is configured in such a way that the variable resistor 46a of the third resistor 43b illustrated in FIG. 14 is replaced by a variable resistor 46c. The variable resistor 46c additionally includes third output transistors 55a to 55n in n stages (n is a natural number) and output fuse circuits 56a to 56n in n stage to the transistor 46.

The transistor 46 and the third output transistors 55a to 55n are formed of an NMOS. In addition, in FIG. 17, three of the third output transistors 55a, 55b, and 55n, and three of the output fuse circuits 56a, 56b, and 56n are shown. However, it is possible to set the stage number n of the output transistor and the output fuse circuit to a given number. In addition, it is possible to set the on resistance of each of the third output transistors 55a to 55n to a value weighted with 2 to the m-th power (m is a natural number of n or less).

A bias voltage with the above-mentioned temperature characteristics is inputted to the gate of each of the transistor 46 and the third output transistors 55a to 55n. The on resistance Ron of the variable resistor 46c also has the temperature characteristics.

The output transistors 55a to 55n and the output fuse circuits 56a to 56n are connected in series between the drain and source of the transistor 46. The third output transistor 55a and the output fuse circuit 56a are connected in series between the drain and source of the transistor 46. The third output transistor 55b and the output fuse circuit 56b are connected in series between the drain and source of the transistor 46. The third output transistor 55n and the output fuse circuit 56n are connected in series between the drain and source of the transistor 46. The same things are applied to the other third output transistors and output fuse circuits, not shown in the drawing.

It is possible to adjust the value of the on resistance of the variable resistor 46c by individually disconnecting the output fuse circuits 56a to 56n.

Thus, according to the power detector 1k, even in the case where the ratio of the individual resistances of the first to third resistors 36, 37, and 43d is changed due to variations in production or the like, it is possible to adjust the value of the on resistance of the variable resistor 46c to the optimum value. Accordingly, it is made possible to eliminate the influence of variations in production for compensating the temperature characteristics.

In the power detector 1k, the third output transistors 55a to 55n are connected to the transistor 46 individually through the output fuse circuits 56a to 56n in parallel. As a result, even in the case where the resistances of the output fuse circuits 56a to 56n are changed due to variations in production or the like, for example, the on resistance Ron of the variable resistor 46c receives a smaller influence than the power detector 1i illustrated in FIG. 14 does. Accordingly, it is made possible to more accurately adjust the on resistance of the variable resistor.

Moreover, also in the power detector 1k, the reference voltage generator 2, the square signal generator 3, and the detection circuit 4 are the same as those in the above-mentioned power detector, and it is made possible to detect the input signal in a wide dynamic range. Furthermore, it is made possible to improve the responsiveness to a sudden power change in the input-output characteristics.

Figure 18:
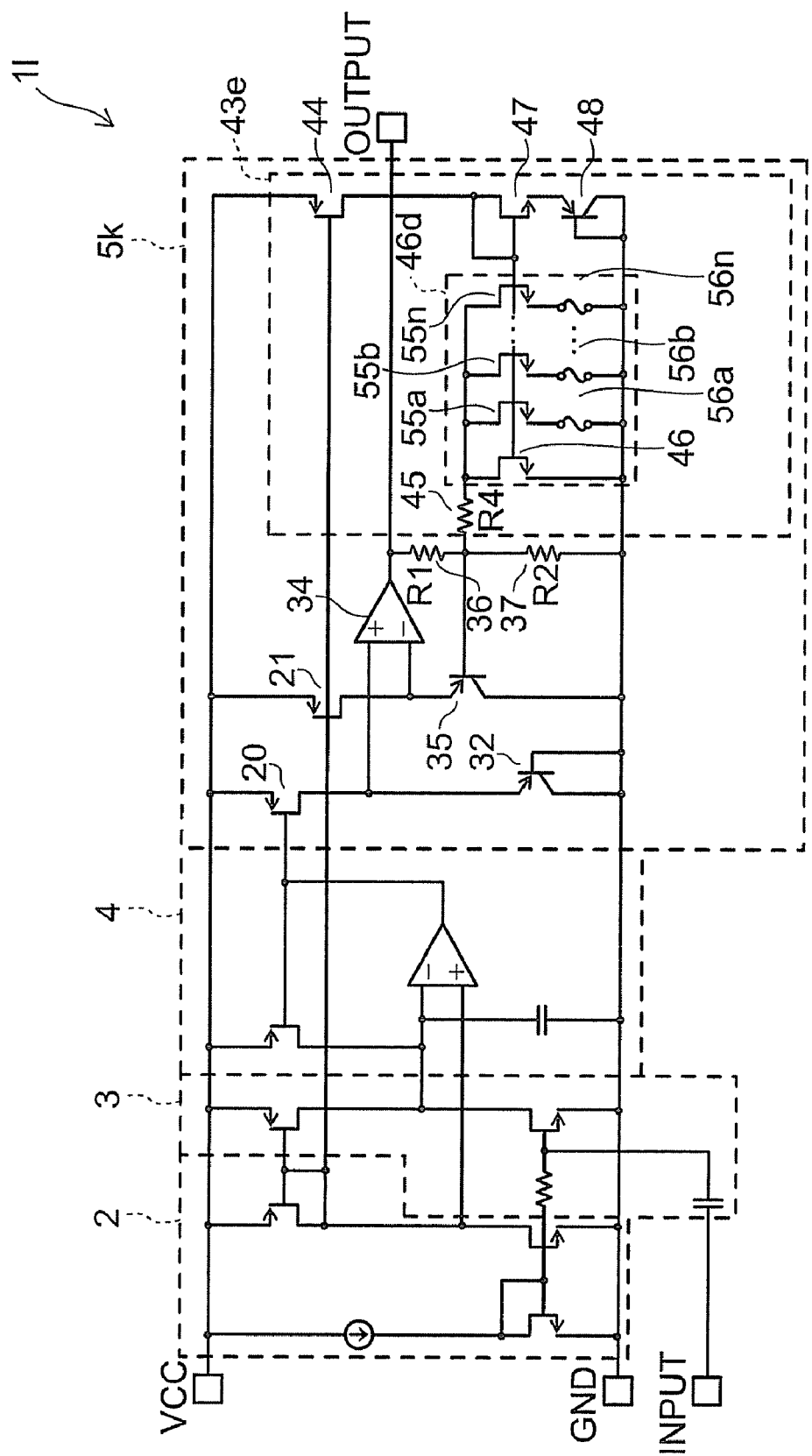
FIG. 18 is yet another circuit diagram illustrating the configuration of the power detector according to the seventh embodiment.

FIG. 18 is yet another circuit diagram illustrating the configuration of the power detector according to the seventh embodiment.

As illustrated in FIG. 18, a power detector 1l is configured in such a way that the third output transistors 55a to 55n of the power detector 1k illustrated in FIG. 17 are placed on the low side and the output fuse circuits 56a to 56n are placed on the high side. The other configurations are the same as those in the power detector 1k illustrated in FIG. 17. In addition, for the reference numerals of the individual components of a reference voltage generator 2, a square signal generator 3, and a detection circuit 4, descriptions are omitted.

Also in the power detector 1l, even in the case where the ratio of the individual resistances of a third resistor 43e and the first and second resistors 36 and 37 to the value of the on resistance of a variable resistor 46d in the output circuit 5k, it is possible to adjust the value of the on resistance of the variable resistor 46d to the optimum value. Thus, it is made possible to eliminate the influence of variations in production for compensating the temperature characteristics.

Moreover, also in the power detector 1l, the reference voltage generator 2, the square signal generator 3, and the detection circuit 4 are the same as those in the above-mentioned power detector, and it is made possible to detect the input signal in a wide dynamic range. Furthermore, it is made possible to improve the responsiveness to a sudden power change in the input-output characteristics.

Eighth Embodiment

Figure 19:
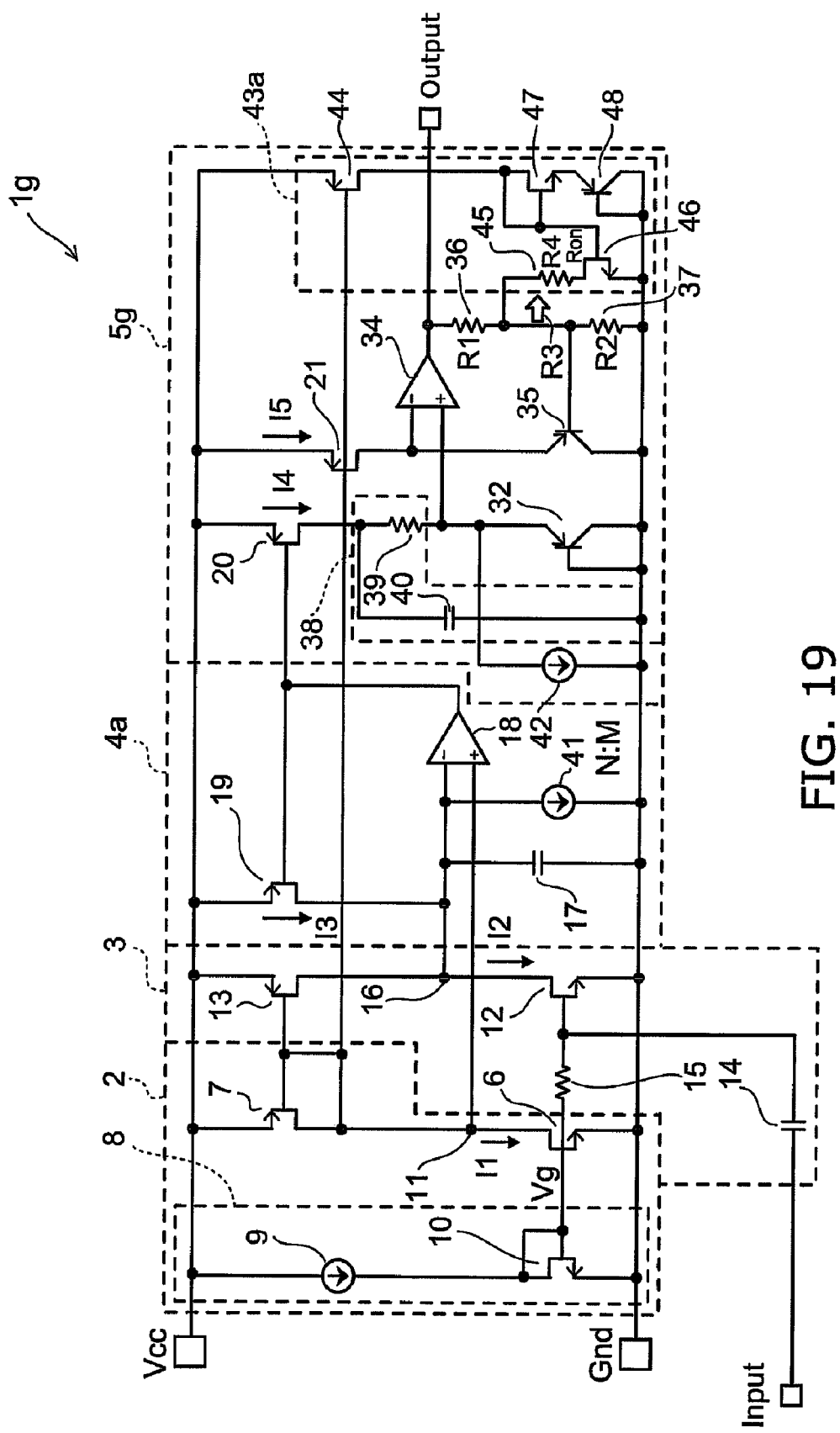
FIG. 19 is a circuit diagram illustrating the configuration of a power detector according to an eighth embodiment.

FIG. 19 is a circuit diagram illustrating the configuration of a power detector according to an eighth embodiment.

As illustrated in FIG. 19, a power detector 1g includes a reference voltage generator 2, a square signal generator 3, a detection circuit 4a, and an output circuit 5g.

The power detector 1g is configured in such a way that the detection circuit 4 and the output circuit 5f of the power detector 1f illustrated in FIG. 10 are replaced by the detection circuit 4a and the output circuit 5g, respectively. The reference voltage generator 2 and the square signal generator 3 are the same as those in the power detector 1f illustrated in FIG. 10.

The detection circuit 4a is the same as the detection circuit 4a of the power detector 1d illustrated in FIG. 8, which is configured in such a way that the first current generator 41 is additionally provided in the detection circuit 4 of the power detector 1f illustrated in FIG. 10.

The output circuit 5g is configured in such a way that the second lowpass filter 38 and the second current generator 42 are additionally provided in the output circuit 5f illustrated in FIG. 10.

As explained in FIG. 7, the current I4 of the first output transistor 20 proportional to the square mean value of the input voltage Input before logarithmic transformation, i.e., input signal power, is passed through the second lowpass filter 38, so that it is made possible to output the mean value for the power that is fluctuating. Alternatively, it is possible to obtain the output near the detected root-mean-square value in such a way that the cutoff frequency of the second lowpass filter 38 is set to a frequency that filters the frequency of power fluctuations to average power fluctuations.

As explained in FIG. 8, the first and second current generators 41 and 42 are additionally provided, so that a constant current is drawn from the feedback transistor 19 and the first output transistor 20. As a result, it is possible to stabilize a bias under low input conditions where input signal power is low, and to extend detectable input signal power to the low power side. It is made possible to detect input signal power in a wide dynamic range. In addition, it is made possible to improve the responsiveness to a sudden power change in the input-output characteristics.

As explained in FIGS. 10 and 11, it is possible to provide the temperature characteristics to the resistance of the transistor 46 by including the third resistor 43a. Moreover, it is possible that the size of the transistor 46 is selected to obtain a desired amount of the variable resistance for canceling the temperature dependence produced in the reference voltage generator 2, the square signal generator 3, and the detection circuit 4 in the previous stage.

In addition, in the power detector 1g illustrated in FIG. 12, the third resistor 43a illustrated in FIG. 10 is used for the output circuit 5g. However, it is also possible to further eliminate the influence of variations in production using the third resistors 43b, 43c, 43c, and 43d illustrated in FIGS. 14, 15, 17, and 18.

Again referring to FIG. 1, the power detector 1 is configured to have the minimum sensitivity of the input signal power of the input voltage Input to almost zero if device parameters are ideal values. However, slight differences occur in the device parameters. Differences in the parameters of the first and second transistors 6 and 12 greatly affect the entire power detector 1.

For example, when an offset occurs because of the differences in the device parameters, the first current I1 flowing through the first transistor 6 and the second current I2 flowing through the second transistor 12 do not hold I1=I2 under no-signal conditions. In the case where the second current I2 is greater than the first current I1, the feedback current I3 flows through the feedback transistor 19 under no-signal conditions, and the voltage is outputted to the output signal Output. Contrary to this, in the case where the second current I2 is smaller than the first current I1, the feedback current I3 does not flow through the feedback transistor 19 until the input signal power reaches a certain level, and the voltage of the output signal Output remains zero until it reaches a certain level.

Figure 20:
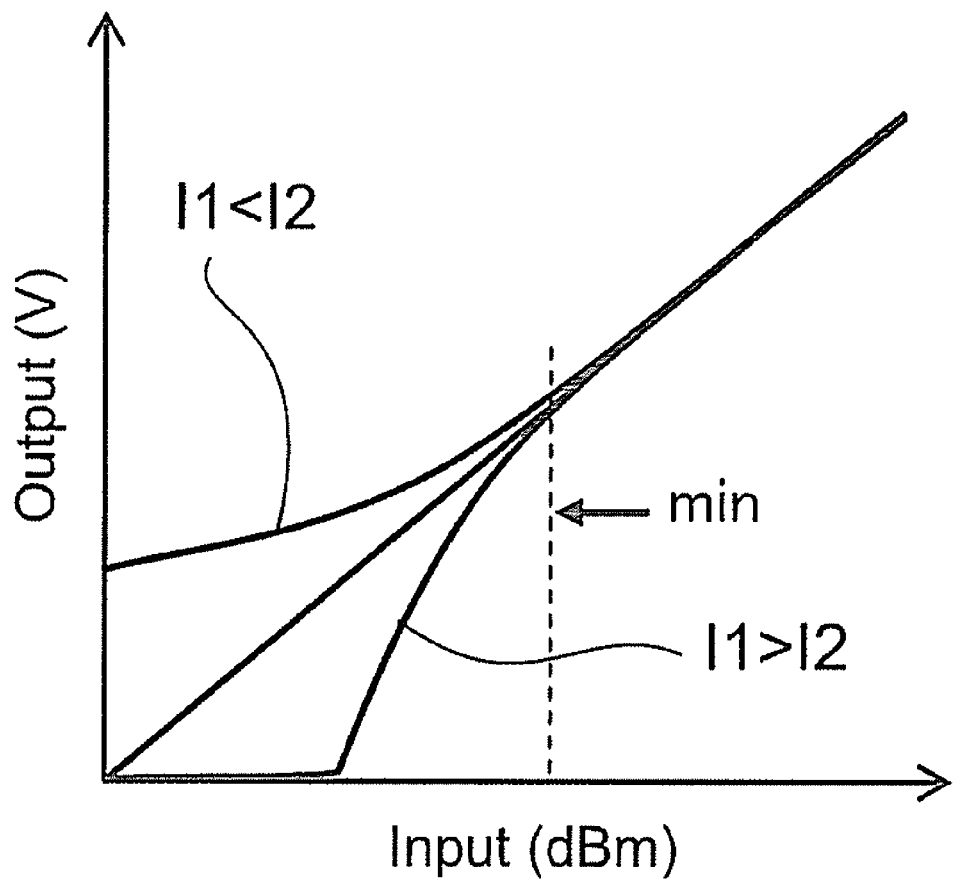
FIG. 20 is a graph schematically illustrating the input-output characteristics of the power detector illustrated in FIG. 1.

FIG. 20 is a graph schematically illustrating the input-output characteristics of the power detector illustrated in FIG. 1.

In FIG. 20, the input signal power of the input voltage Input is plotted on the horizontal axis in dBm, and the voltage of the output signal Output is plotted on the vertical axis. In addition, the voltage of the output signal Output is expressed as the relationship between the magnitudes of the first and second currents I1 and I2 under no-signal conditions is a parameter.

Under low input conditions where input signal power is low, the linearity of the voltage of the output signal Output degrades if there is a difference between the first and second currents I1 and I2 under no-signal conditions. Because of this, the minimum sensitivity min remains at a considerably high input level, and a detectable dynamic range narrows.

Ninth Embodiment

Figure 21:
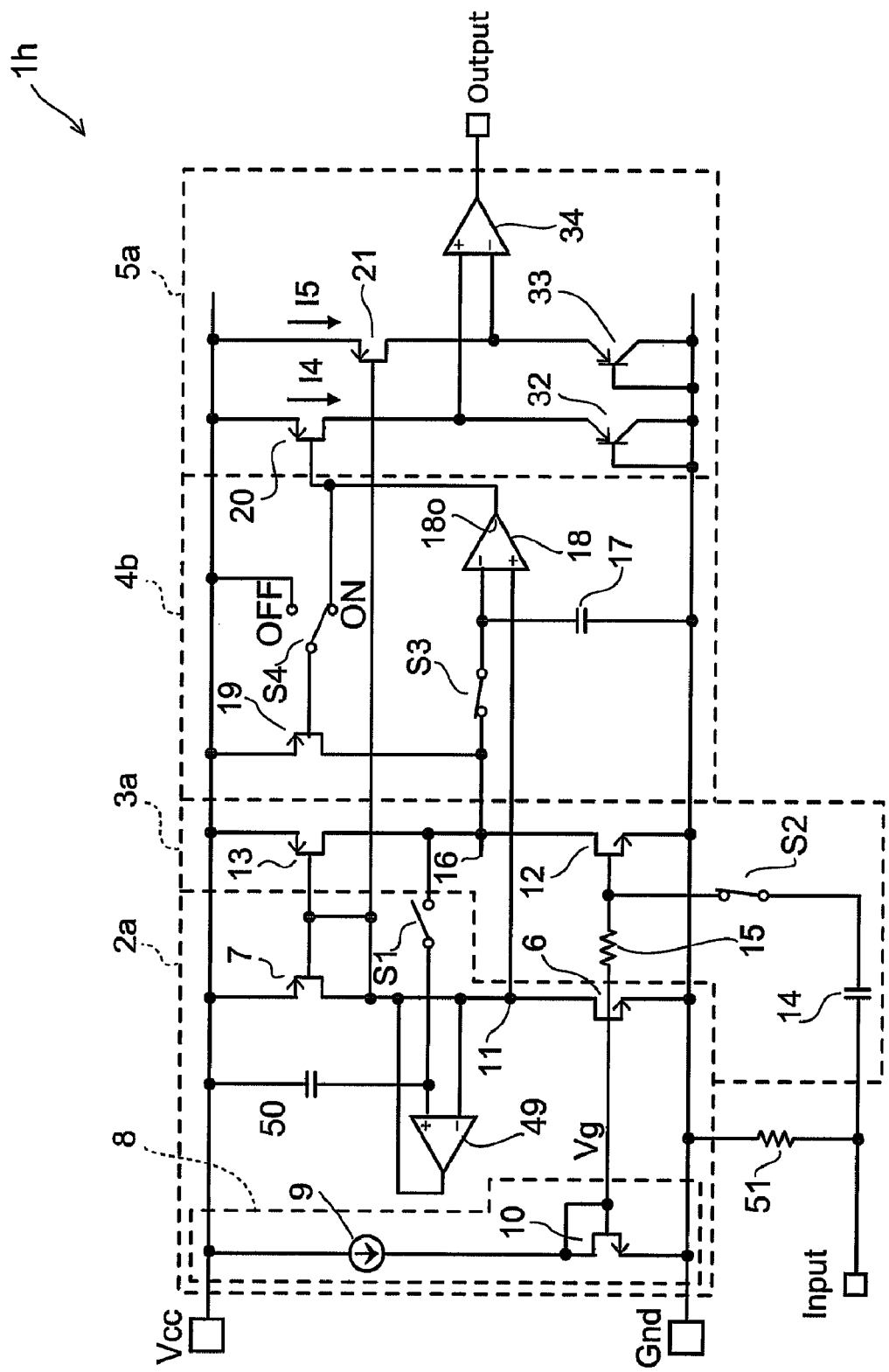
FIG. 21 is a circuit diagram illustrating the configuration of a power detector according to a ninth embodiment.

FIG. 21 is a circuit diagram illustrating the configuration of a power detector according to a ninth embodiment.

As illustrated in FIG. 21, a power detector 1h includes a reference voltage generator 2a, a square signal generator 3a, a detection circuit 4b, and an output circuit 5a. The output circuit 5a is the same as the output circuit 5a of the power detector 1a illustrated in FIG. 3.

The power detector 1h has the state of canceling an offset and the state of performing detection. For example, the clock signal is used for controlling in which the offset is cancelled in a first period and detection is performed in a second period, as described below. In addition, in performing detection, the input signal power of the input voltage Input is subjected to logarithmic transformation for output.

The reference voltage generator 2a has a first transistor 6, a first load circuit 7, a bias circuit 8, a first switch S1, a third operational amplifier 49, and a first capacitor 50.

The reference voltage generator 2a is configured in such a way that the first switch S1, the third operational amplifier 49, and the first capacitor 50 are additionally provided in the reference voltage generator 2 illustrated in FIG. 1. The first transistor 6, the first load circuit 7, and the bias circuit 8 are the same as those in, FIG. 1.

One end of the first switch S1 is connected to the output terminal 16 of the square signal generator 3a, and the other end thereof is connected to the non-inverting input terminal of the third operational amplifier 49. One end of the first capacitor 50 is connected to the non-inverting input terminal of the third operational amplifier 49, and the supply voltage Vcc is supplied to the other end thereof. The inverting input terminal of the third operational amplifier 49 is connected to a connection point 11 between the first transistor 6 and the first load circuit 7. The output terminal of the third operational amplifier 49 is connected to the connection point 11.

In FIG. 21, the supply voltage Vcc is supplied to the other end of the first capacitor 50. However, it is sufficient that the first capacitor 50 holds the voltage of the second transistor 12 of the square signal generator 3a inputted to the non-inverting input terminal of the third operational amplifier 49. It is also possible to connect the other end thereof to the ground.

The first switch S1 is on in the first period, whereas it is off in the second period.

The square signal generator 3a has a second transistor 12, a second load circuit 13, a capacitor 14, resistors 15 and 51, and a second switch S2.

The square signal generator 3a is configured in such a way that the second switch S2 and the resistor 51 are additionally provided in the square signal generator 3 illustrated in FIG. 1.

The second switch S2 is connected between the capacitor 14 and the first transistor 12, and it is off in the first period, and on in the second period.

The resistor 51 regulates the input impedance of the square signal generator 3a. In addition, the resistor 51 regulates the potential of the capacitor 14 while the second switch S2 is off.

The detection circuit 4b has a first lowpass filter 17, a first operational amplifier 18, a feedback transistor 19, a third switch S3, and a fourth switch S4.

The detection circuit 4b is configured in such a way that the third and fourth switches S3 and S4 are additionally provided in the detection circuit 4 illustrated in FIG. 1. The first lowpass filter 17, the first operational amplifier 18, and the feedback transistor 19 are the same as those in, FIG. 1.

One end of the third switch S3 is connected to the output terminal 16 of the square signal generator 3a and the drain of the feedback transistor 19, and the other end thereof is connected to the inverting input terminal of the first operational amplifier 18 and the first lowpass filter 17.

The third switch S3 is off in the first period, and on in the second period.

The fourth switch S4 connects the gate of the feedback transistor 19 to the ground or the output terminal 18o of the first operational amplifier 18. The fourth switch S4 connects the gate of the feedback transistor 19 to the ground in the first period, and connects the gate of the feedback transistor 19 to the output terminal 18o of the first operational amplifier 18 in the second period.

The first to fourth switches S1 to S4 are controlled in such a way that they are switched in synchronization with a clock CLK, for example.

FIGS. 22A to 22E are timing charts illustrating the states of the individual switches of the power detector 1h illustrated in FIG. 21, and FIG. 22A shows the state of the clock CLK, FIG. 22B shows the state of the first switch S1, FIG. 22C shows the state of the second switch S2, FIG. 22D shows the state of the third switch S3, and FIG. 22E shows the state of the fourth switch S4.

For the fourth switch S4, such a state is referred to as off in which it connects the gate of the feedback transistor 19 to the ground to cause the feedback current I3 of the feedback transistor not to flow in the first period. In addition, such a state is referred to as on in which the fourth switch S4 connects the gate of the feedback transistor 19 to the output terminal 18o of the first operational amplifier 18 to cause the feedback current I3 to be controllable in the second period.

As illustrated in FIG. 22A, a period t1 in which the clock CLK is at high level is the first period in which the offset is cancelled, and a period t2 in which the clock CLK is at low level is the second period in which detection is performed. It is possible that the first period in which the offset is cancelled is shorter than the second period in which detection is performed. Desirably, the first period is set as short as possible so that the influence on detection is made smaller. For example, the clock CLK is formed in a pulse having a duty cycle of $\frac{1}{16}$, and is used in the first period in which the offset is cancelled by $\frac{1}{16}$ of the total time.

As illustrated in FIG. 22B, the first switch S1 is on in the first period, and off in the second period. Moreover, as illustrated in FIGS. 22C to 22E, the second to fourth switches S2 to S4 are off in the first period, and on in the second period.

Figure 23:
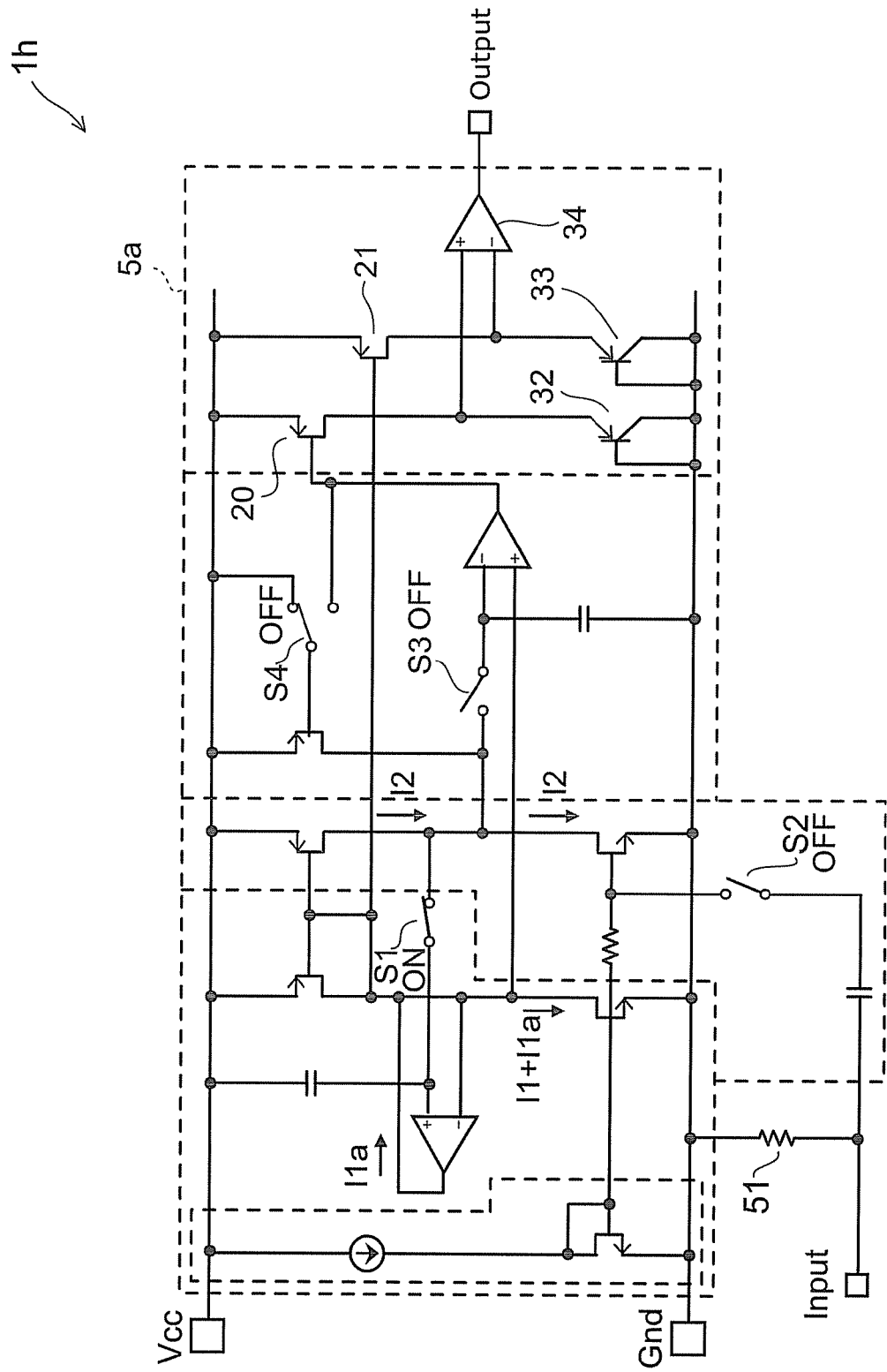
FIG. 23 is a circuit diagram when the offset is cancelled in the power detector illustrated in FIG. 21.

FIG. 23 is a circuit diagram when the offset is cancelled in the power detector illustrated in FIG. 21.

FIG. 23 illustrates the states of the first to fourth switches S1 to S4 in the power detector 1h in the first period. In addition, for the reference numerals of the components other than the first to fourth switches S1 to S4, descriptions are omitted.

The first switch S1 is turned on, and the output voltage of the square signal generator 3a is inputted to the non-inverting input terminal of the third operational amplifier 49 through the first switch S1. The reference voltage, which is the output of the reference voltage generator 2a, is inputted to the inverting input terminal of the third operational amplifier 49.

The third operational amplifier 49 amplifies the differential voltage between the reference voltage, which is the output of the reference voltage generator 2a, and the output voltage of the square signal generator 3a. A correction current I1a of the third operational amplifier 49 is fed back to the first transistor 6 of the reference voltage generator 2a. The first current I1 and the correction current I1a of the third operational amplifier 49 flow through the first transistor 6.

The second switch S2 is off, and the input voltage Input is not inputted to the square signal generator 3a. Moreover, the third switch S3 is off, and the output of the square signal generator 3a is not inputted to the non-inverting input terminal of the first operational amplifier 18. Furthermore, the fourth switch S4 is off, the supply voltage Vcc is inputted to the gate of the feedback transistor 19, and the feedback transistor 19 is off. The feedback transistor 19 is disconnected, and the feedback current I3 does not flow therethrough.

The feedback current I3 is not fed back from the detection circuit 4b to the second transistor 12 of the square signal generator 3a. Because the second switch S2 is off, the input voltage Input is not inputted to the second transistor 12. Thus, the first current I1 is equal to the second current I2 if the device parameters of the first transistor 6 and the second transistor 12 are the same. However, the first current I1 is not made equal to the second current I2 because of the difference between the device parameters.

The third operational amplifier 49 carries the correction current I1a through the first transistor 6 of the reference voltage generator 2a to compensate the offset voltage between the reference voltage of the reference voltage generator 2a and the output voltage of the square signal generator 3a to zero. In addition, the output of the second transistor 12 of the square signal generator 3a is held at the first capacitor 50, and the offset voltage is cancelled even in the second period in which the first switch S1 is off.

Figure 24:
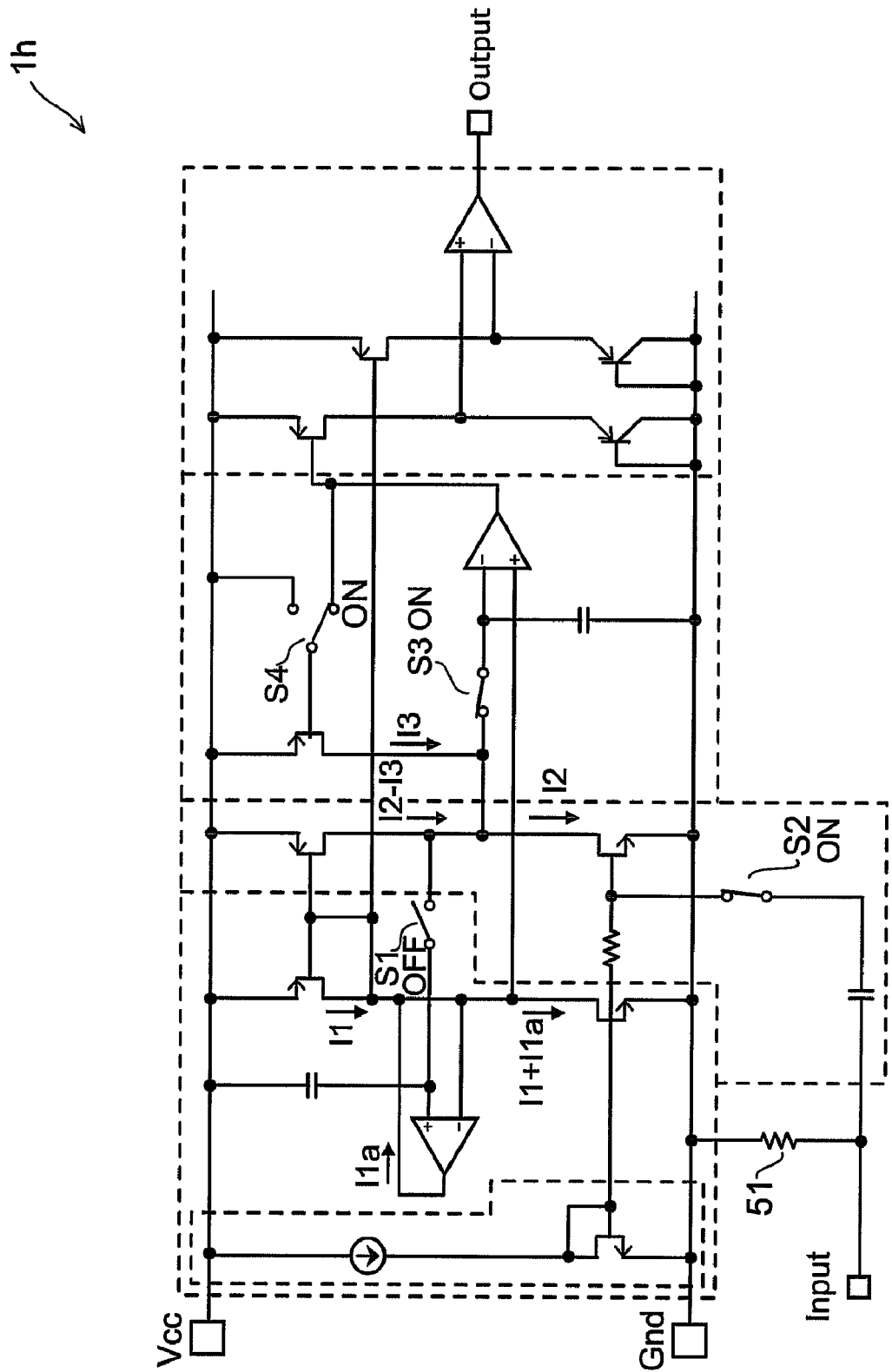
FIG. 24 is a circuit diagram in performing detection by the power detector illustrated in FIG. 21.

FIG. 24 is a circuit diagram in performing detection by the power detector illustrated in FIG. 21.

FIG. 24 illustrates the states of the first to fourth switches S1 to S4 in the power detector 1h in the second period. In addition, for the reference numerals of the components other than the first to fourth switches S1 to S4, descriptions are omitted.

The first switch S1 is turned off, and the output of the square signal generator 3a is not inputted to the non-inverting input terminal of the third operational amplifier 49.

However, as described above, the output of the second transistor 12 of the square signal generator 3a is held at the first capacitor 50. Because of this, even in the second period, the correction current I1a of the third operational amplifier 49 is fed back to the first transistor 6 of the reference voltage generator 2a, and the offset voltage is cancelled.

The second switch S2 is turned on, and the input voltage Input is inputted to the square signal generator 3a. The third switch S3 is turned on, and the output voltage of the square signal generator 3a is inputted to the inverting input terminal of the first operational amplifier 18. The fourth switch S4 is turned on, the control voltage is inputted from the first operational amplifier 18 to the gate of the feedback transistor 19, and the feedback current I3 is fed back from the detection circuit 4b to the square signal generator 3a. Thus, as illustrated in FIG. 24, in the second period, the power detector 1h is equivalent to the power detector 1 illustrated in FIG. 1.

Figure 25:
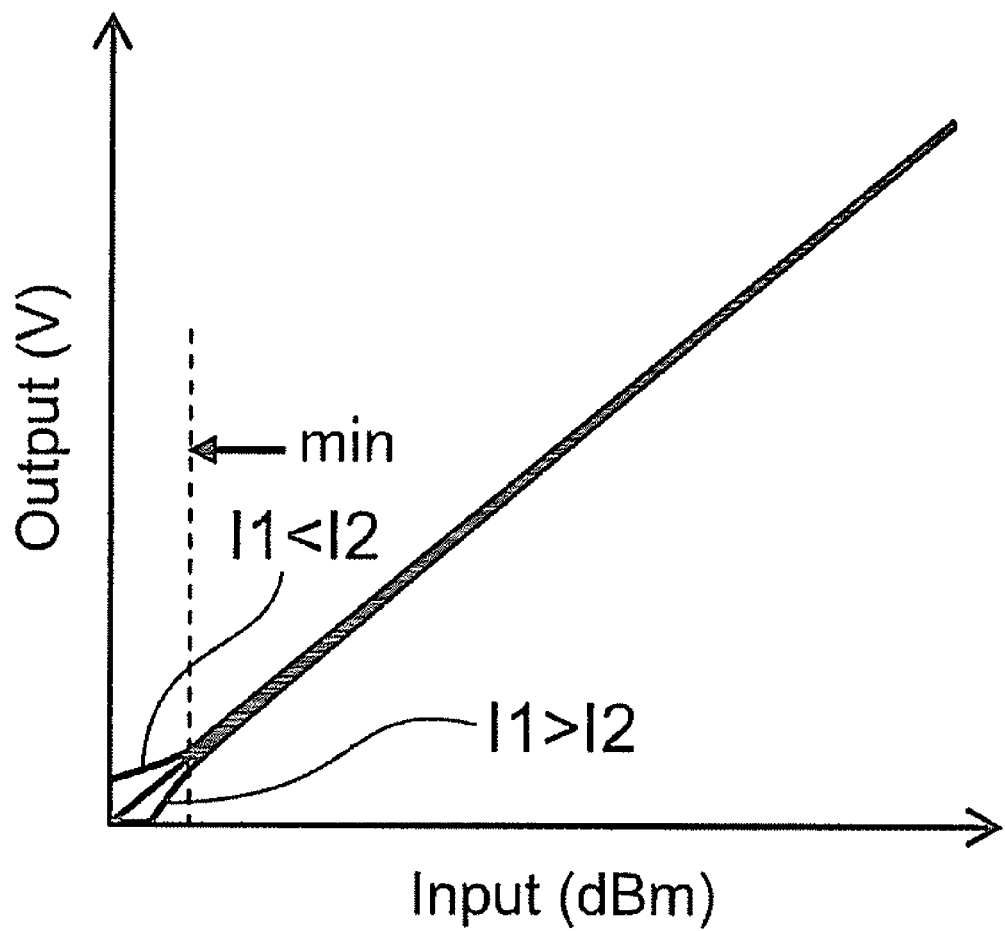
FIG. 25 is a graph schematically illustrating the input-output characteristics of the power detector illustrated in FIG. 21.

FIG. 25 is a graph schematically illustrating the input-output characteristics of the power detector 1h illustrated in FIG. 21.

In FIG. 25, the input signal power of the input voltage Input is plotted on the horizontal axis in dBm, and the voltage of the output signal Output is plotted on the vertical axis. In addition, the voltage of the output signal Output is expressed as the relationship between the magnitudes of the first and second currents I1 and I2 under no-signal conditions is a parameter.

Because the offset voltage is cancelled, the range that the linearity of the voltage of the output signal Output is provided is extended as well under the conditions of low input signal power. The minimum sensitivity min drops to low input level as compared with the case where the offset voltage is not compensated as illustrated in FIG. 20, and a detectable dynamic range increases.

Figure 22:
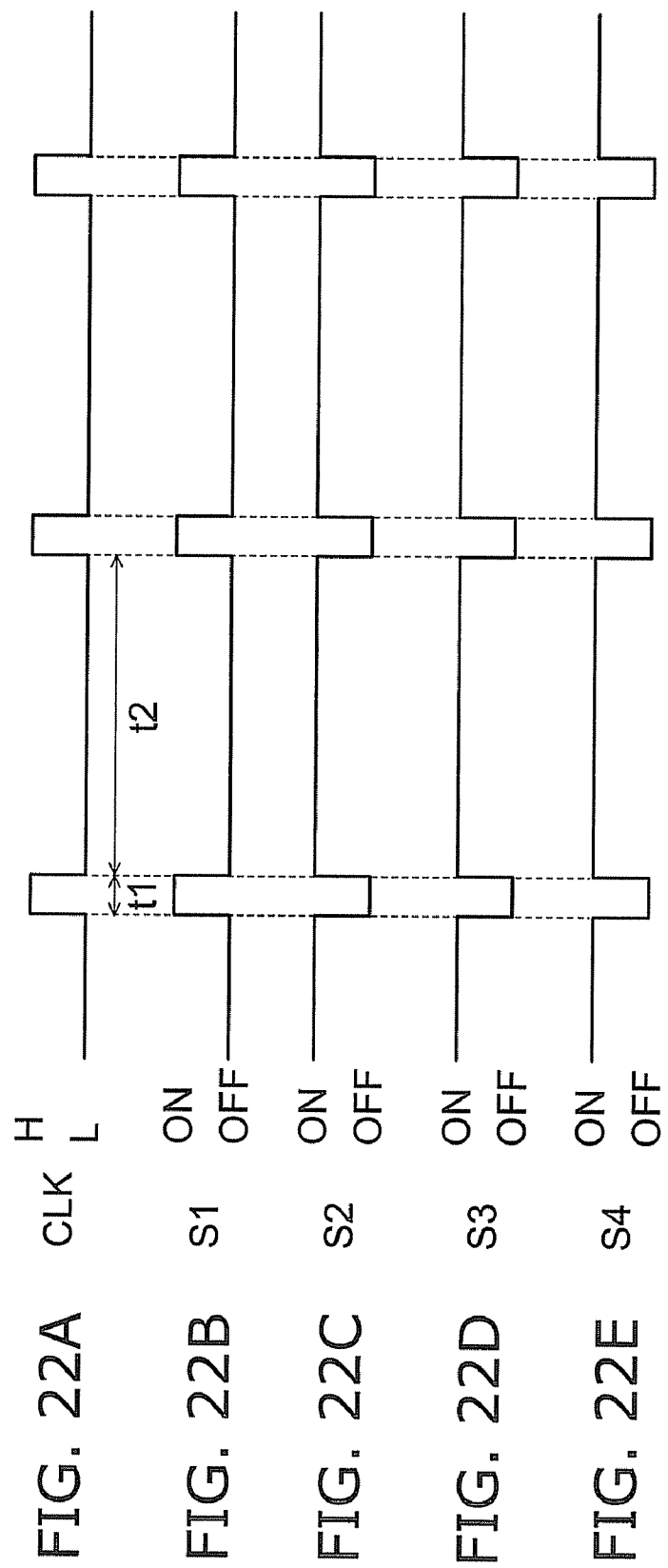
FIGS. 22A to 22E are timing charts illustrating the states of individual switches of the power detector illustrated in FIG. 21.

In addition, in FIG. 22, it is possible that the first period in which the offset is cancelled is shorter than the second period in which detection is performed. The first period is set as short as possible so that the influence on detection is made smaller. However, the first period in which the offset is cancelled is set longer than the second period in which detection is performed, so that it is possible to greatly reduce the consumption current. It is made possible to set this in the case where the continuous responsiveness to detect power does not matter.

Figures 26A, 26B, 26C, 26D, 26E:
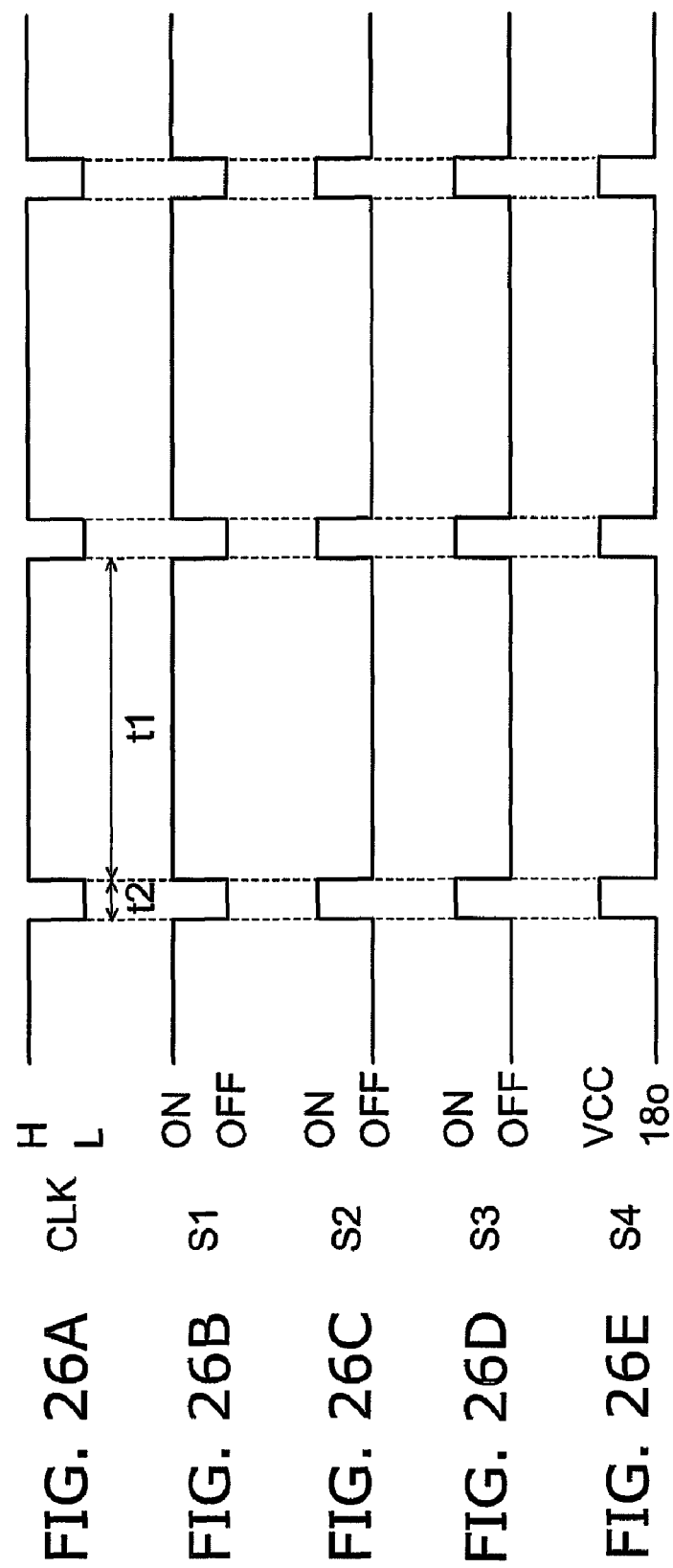
FIGS. 26A to 26E are other timing charts of the individual switches of the power detector illustrated in FIG. 21.

FIGS. 26A to 26E are other timing charts of the individual switches of the power detector illustrated in FIG. 21, and FIG. 26A shows the state of the clock CLK, FIG. 26B shows the state of the first switch S1, FIG. 26C shows the state of the second switch S2, FIG. 26D shows the state of the third switch S3, and FIG. 26E shows the state of the fourth switch S4.

As illustrated in FIG. 26A, the period t1 in which the clock CLK is at high level is set longer than the period t2 in which the clock CLK is at low level.

In the first period in which the offset is cancelled, the power consumption of the power detector 1h is smaller than that in the second period in which detection is performed.

Thus, the period t1 in which the clock CLK is at high level is set longer than the period t2 in which the clock CLK is at low level, so that it is made possible to reduce the power consumption of the power detector 1h.

Tenth Embodiment

It is possible to cancel the offset also according to the other configurations.

Figure 27:
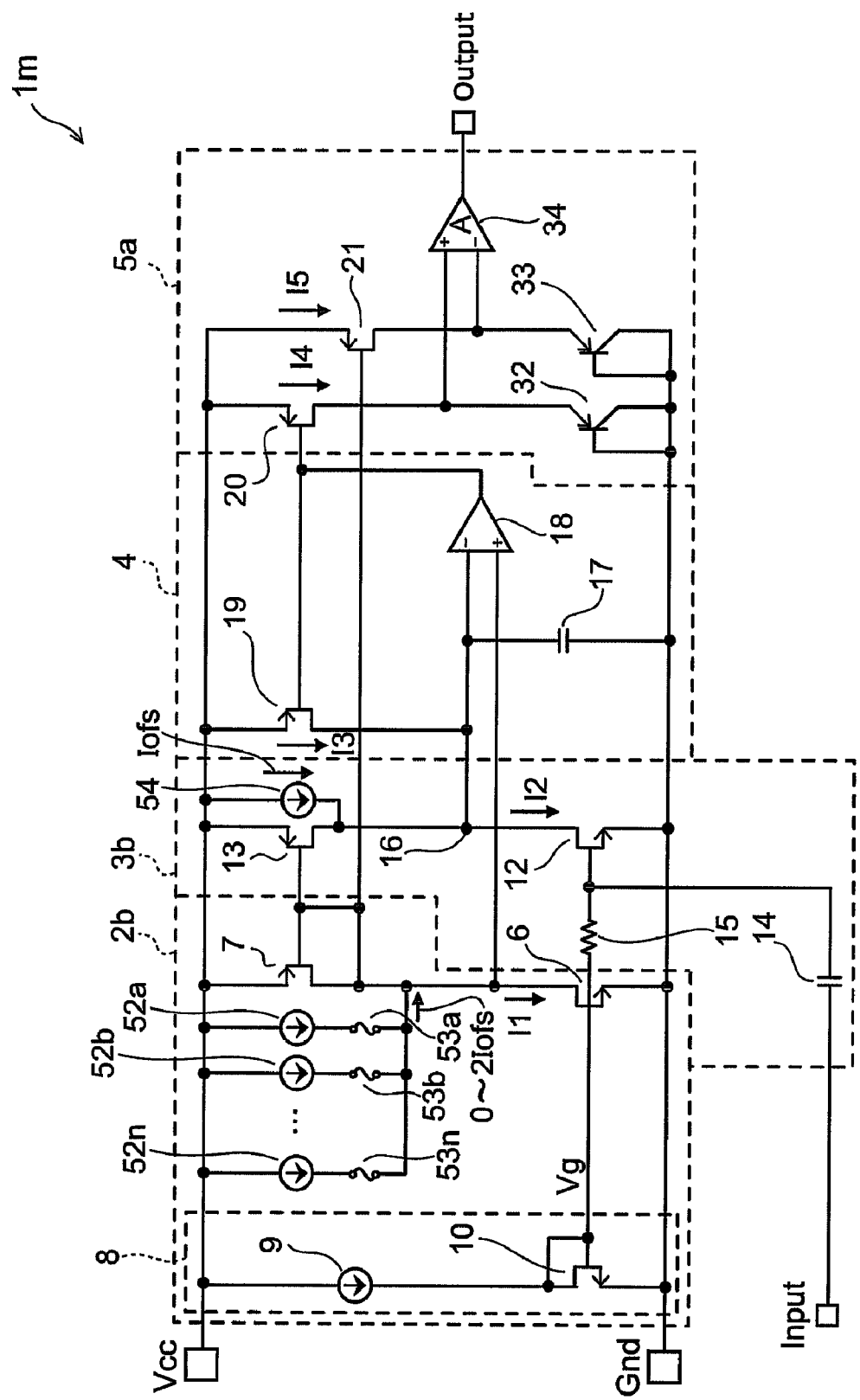
FIG. 27 is a circuit diagram illustrating the configuration of a power detector according to a tenth embodiment.

FIG. 27 is a circuit diagram illustrating the configuration of a power detector according to a tenth embodiment.

As illustrated in FIG. 27, a power detector 1m includes a reference voltage generator 2b, a square signal generator 3b, a detection circuit 4, and an output circuit 5a. The output circuit 5a is the same as the output circuit 5a of the power detector 1a illustrated in FIG. 3.

The reference voltage generator 2b has a first transistor 6, a first load circuit 7, a bias circuit 8, first offset current generators 52a, 52b to 52n in n stages (n is a natural number), and input fuse circuits 53a, 53b to 53n in n stages. More specifically, the reference voltage generator 2b is configured in such a way that the first offset current generators 52a, 52b to 52n and the input fuse circuits 53a, 53b to 53n are additionally provided in the reference voltage generator 2 illustrated in FIG. 1.

The first offset current generators 52a, 52b to 52n and the input fuse circuits 53a, 53b to 53n are connected in series to the drain of the first transistor 6. The first offset current generator 52a and the input fuse circuit 53a are connected in series to the drain of the first transistor 6. The first offset current generator 52b and the input fuse circuit 53b are connected in series to the drain of the first transistor 6. The first offset current generator 52n and the input fuse circuit 53n are connected in series to the drain of the first transistor 6. The same things applied to the other first offset current generators and input fuse circuits, not shown.

The first offset current generators 52a, 52b to 52n respectively supply offset currents $Iofs/2^0$, $Iofs/2^1$ to $Iofs/2^{n-1}$ to the drain of the first transistor 6 through the input fuse circuits 53a, 53b to 53n. Here, the value of the current Iofs is set to the maximum value that is assumed as the offset currents of the first and second transistors 6 and 12.

It is possible to arbitrarily set the currents supplied from the first offset current generators 52a, 52b to 52n to the drain of the first transistor 6 in the range of 0 to 2Iofs by disconnecting the input fuse circuits 53a, 53b to 53n. In addition, a maximum current of about 2Iofs flows before disconnecting the input fuse circuits 53a, 53b to 53n, whereas the current value is zero if all the input fuse circuits are disconnected.

The square signal generator 3b has a second transistor 12, a second load circuit 13, a capacitor 14, a resistor 15, and a second offset current generator 54. More specifically, the square signal generator 3b is configured in such a way that the second offset current generator 54 is additionally provided in the square signal generator 3 illustrated in FIG. 1.

The second offset current generator 54 is connected to the drain of the second transistor 12. The second offset current generator 54 is supplied with the supply voltage Vcc, and supplies the offset current Iofs to the drain of the second transistor 12.

The drain of the first transistor 6 is supplied with adjustable currents of 0 to 2Iofs, and the drain of the second transistor 12 is supplied with the current Iofs.

Before disconnecting the input fuse circuits 53a, 53b to 53n, the offset current supplied to the drain of the first transistor 6 is greater by Iofs. For example, when the device parameter is changed due to variations in production or the like, an offset occurs in the currents of the first and second transistors 6 and 12 under no-signal conditions.

Before disconnecting the input fuse circuits 53a, 53b to 53n, the voltage of the output signal Output under no-signal conditions corresponds to the value that the offsets of the first and second transistors 6 and 12 are added to the current Iofs mentioned above.

Thus, it is made possible to find the offset current Ioffset that is necessary to compensate the offset due to variations in production or the like from the measured value of the voltage of the output signal Output. It is made possible to compensate the offset by disconnecting the corresponding input fuse circuit for reducing the influence such as variations in production.

Figure 28:
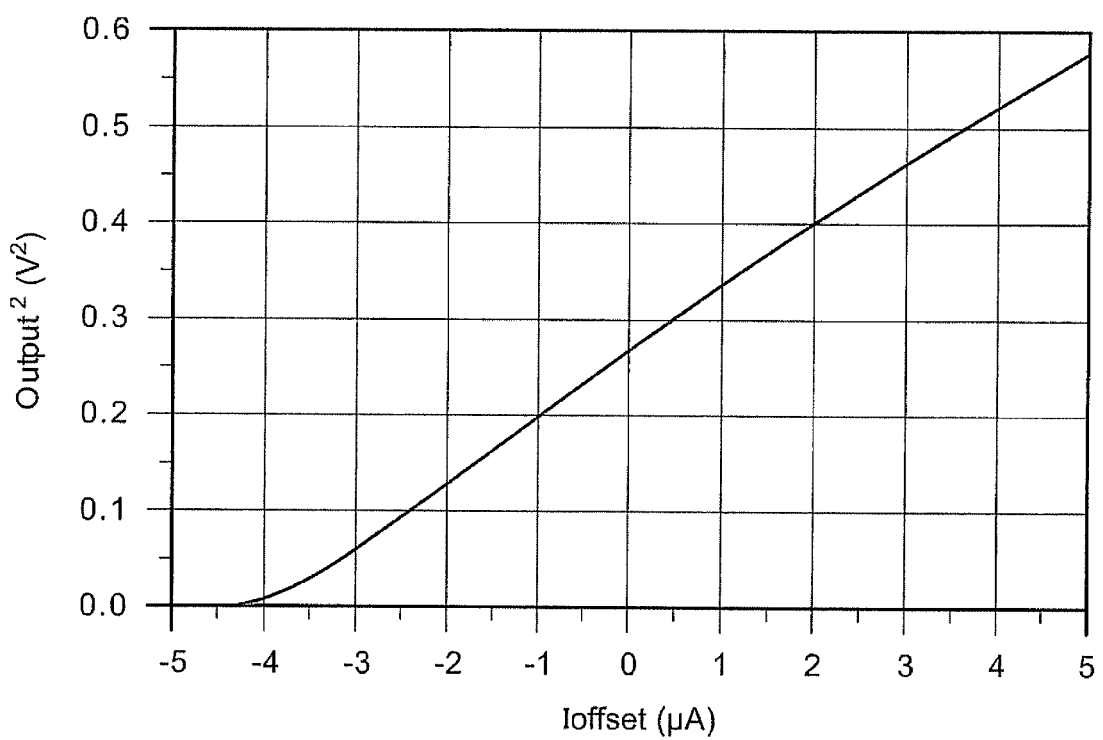
FIG. 28 is a graph illustrating the relationship between the offset current and the output voltage in the power detector illustrated in FIG. 27.

FIG. 28 is a graph illustrating the relationship between the offset current and the output voltage in the power detector illustrated in FIG. 27.

FIG. 28 illustrates the dependency of the voltage of the output signal Output on the offset current Ioffset before disconnecting the input fuse circuits 53a, 53b to 53n.

The offset current Ioffset necessary to compensate the offsets of the first and second transistors 6 and 12 due to variations in production or the like, for example, is plotted on the horizontal axis, and the square of the voltage of the output signal Output under no-signal conditions is plotted on the vertical axis. In addition, the offset current Ioffset on the horizontal axis is positive in the case where the current of the second transistor 12 is greater than the current of the first transistor 6.

For example, in the case where the measured value of the voltage of the output signal Output under no-signal conditions is 0

V, the offset current Ioffset=−Iofs is held (for example, −4.2 μA). In this case, it is unnecessary to disconnect the input fuse circuits 53a, 53b to 53n. The offset current Ioffset increases as the measured value grows in the positive direction. The input fuse circuits 53a, 53b to 53n will be disconnected according to a necessary offset current Ioffset.

As discussed above, according to the power detector 1m, because the offset caused by the influence such as variations in production is cancelled, it is possible to extend the range that the linearity of the voltage of the output signal Output is provided as well under low input conditions where the input signal is low.

Thus, it is made possible to extend the detectable input signal to the low power side. It is made possible to detect input signal power in a wide dynamic range. In addition, it is made possible to improve a response to a sudden power change in the input-output characteristics.

Figure 29:
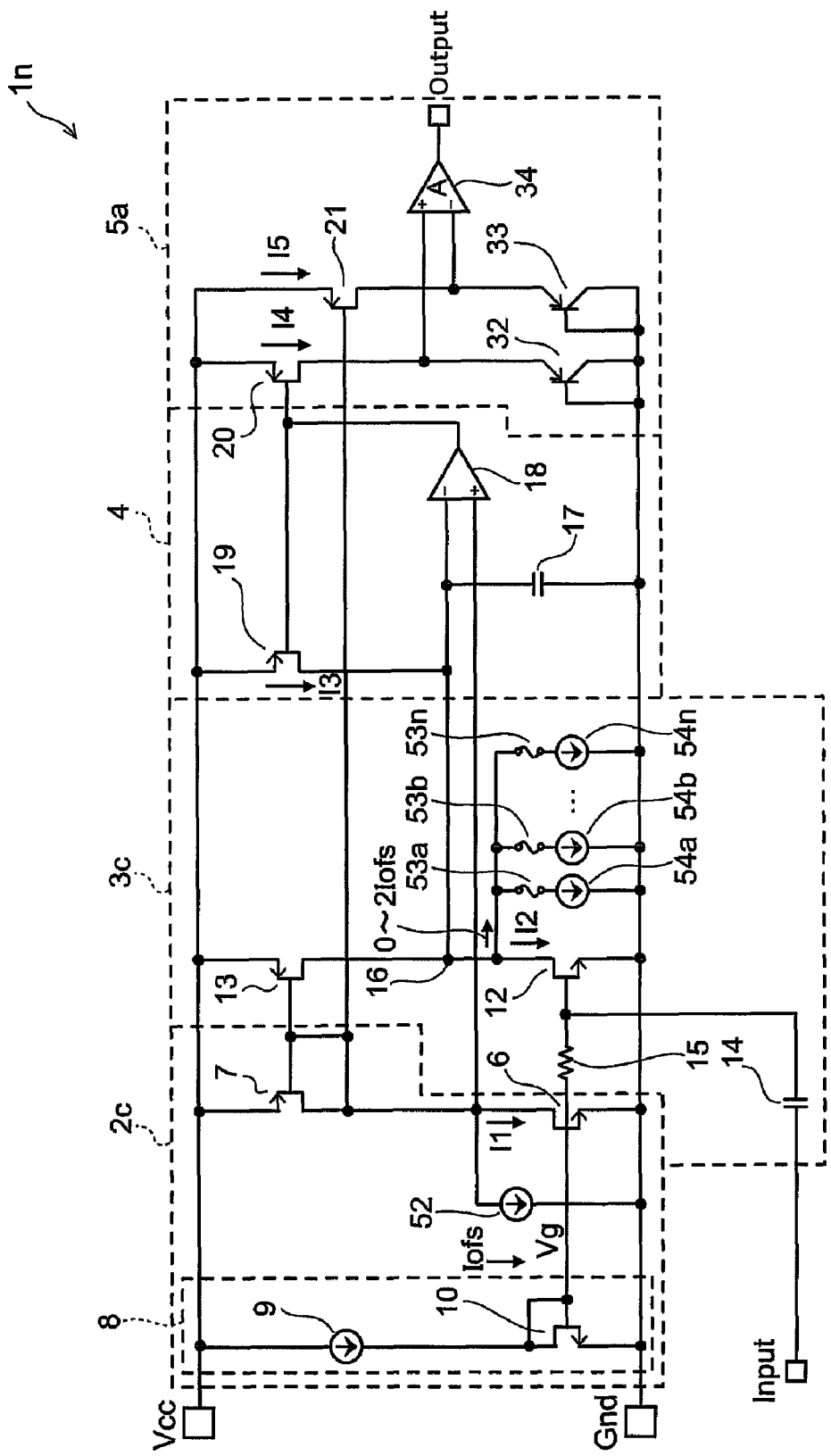
FIG. 29 is a circuit diagram illustrating another configuration of the power detector according to the tenth embodiment.

FIG. 29 is a circuit diagram illustrating another configuration of the power detector according to the tenth embodiment.

As illustrated in FIG. 29, a power detector in includes a reference voltage generator 2c, a square signal generator 3c, a detection circuit 4, and an output circuit 5a. The output circuit 5a is the same as the output circuit 5a of the power detector 1a illustrated in FIG. 3.

The reference voltage generator 2c has a first transistor 6, a first load circuit 7, a bias circuit 8, and a first offset current generator 52. More specifically, the reference voltage generator 2c is configured in such a way that the first offset current generator 52 is additionally provided in the reference voltage generator 2 illustrated in FIG. 1.

The first offset current generator 52 is connected between the drain of the first transistor 6 and the ground Gnd. The first offset current generator 52 extracts the offset current Iofs from the drain of the first transistor 6.

The square signal generator 3c has a second transistor 12, a second load circuit 13, a capacitor 14, a resistor 15, second offset current generator 54a, 54b to 54n in n stages (n is a natural number), and input fuse circuits 53a, 53b to 53n in n stages. More specifically, the square signal generator 3c is configured in such a way that the second offset current generators 54a, 54b to 54n and the input fuse circuits 53a, 53b to 53n are additionally provided in the square signal generator 3 illustrated in FIG. 1.

The second offset current generators 54a, 54b to 54n and the input fuse circuits 53a, 53b to 53n are connected in series to the drain of the second transistor 12. The second offset current generator 54a and the input fuse circuit 53a are connected in series to the drain of the second transistor 12. The second offset current generator 54b and the input fuse circuit 53b are connected in series to the drain of the second transistor 12. The second offset current generator 54n and the input fuse circuit 53n are connected in series to the drain of the second transistor 12. The same things are applied to the other second offset current generators and input fuse circuits, not shown.

The second offset current generators 54a, 54b to 54n respectively extract the offset currents Iofs/$2^0$, Iofs/$2^1$ to Iofs/$2^{n-1}$ from the drain of the second transistor 12 through the input fuse circuits 53a, 53b to 53n. Here, the value of the current Iofs is set to the maximum value that is assumed as the offset currents of the first and second transistors 6 and 12.

It is possible to arbitrarily set the currents that the second offset current generators 54a, 54b to 54n extract from the drain of the second transistor 12 in the range of 0 to 2Iofs by disconnecting the input fuse circuits 53a, 53b to 53n. In addition, a maximum current of about 2Iofs flows before disconnecting the input fuse circuits 53a, 53b to 53n, whereas the current value is zero if all the circuits are disconnected.

As explained in FIG. 28, the offset current Ioffset that is necessary to compensate the offset due to variations in production or the like is found from the measured value of the voltage of the output signal Output under no-signal conditions. It is made possible to compensate the offset by disconnecting the corresponding input fuse circuit for reducing the influence such as variations in productions 53a, 53b to 53n.

As discussed above, according to the power detector 1n, because the offset caused by the influence such as variations in production is cancelled, it is possible to extend the range that the linearity of the voltage of the output signal Output is provided as well under low input conditions where the input signal is low.

Thus, it is made possible to extend the detectable input signal to the low power side. It is made possible to detect input signal power in a wide dynamic range. In addition, it is made possible to improve a response to a sudden power change in the input-output characteristics.

Figure 30:
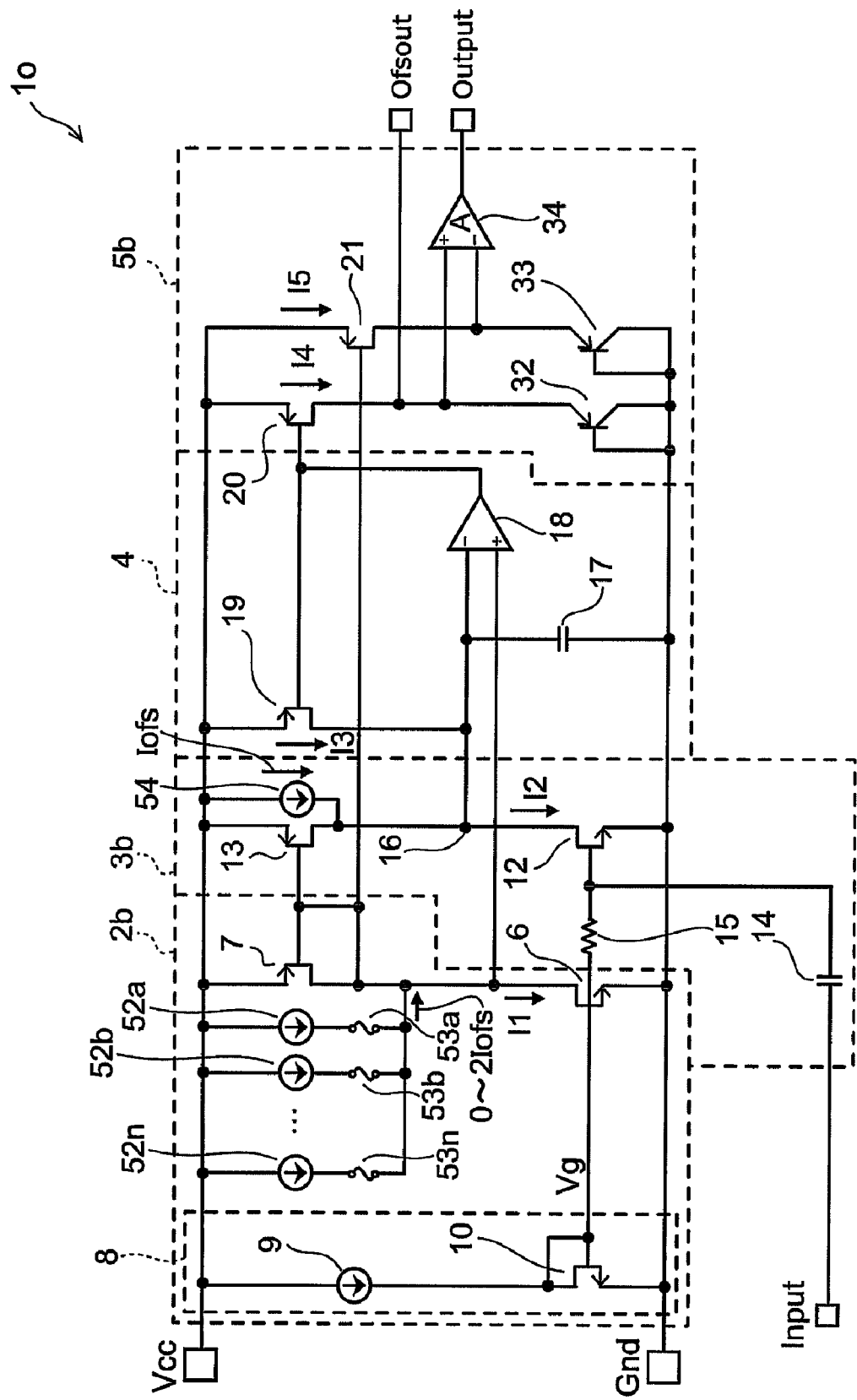
FIG. 30 is a circuit diagram illustrating still another configuration of the power detector according to the tenth embodiment.

FIG. 30 is a circuit diagram illustrating still another configuration of the power detector according to the tenth embodiment.

As illustrated in FIG. 30, a power detector 1o is configured in such a way that the output circuit 5a of the power detector 1m illustrated in FIG. 27 is replaced by an output circuit 5b.

The output circuit 5b additionally includes an offset measurement terminal Ofsout to the output circuit 5a.

The offset measurement terminal Ofsout is connected to the connection point between the first output transistor 20 and the first converter 32. For example, in the case where the first and second converters 32 and 33 are formed of a pnp bipolar transistor as illustrated in FIG. 30, it is likely that an offset occurs in the output values of the first and second converters 32 and 33 due to variations in production or the like. In addition, it is likely that an offset occurs in the second operational amplifier 34 due to variations in production of devices or the like.

Thus, in the case where the voltage of the output signal Output under no-signal conditions is measured, it is likely to cause error in measuring the offset current.

For this reason, in the output circuit 5b, the offset measurement terminal Ofsout is provided, which is connected to the connection point between the first transistor 20 and the first converter 32. It is possible to measure the drain current I4 of the first transistor before converted into the voltage of the first converter 32, and to detect the offset current more highly accurately.

For example, in the case where a pnp bipolar transistor is used for the first converter 32, a pad is connected to its emitter terminal, so that the pad can be used for the offset measurement terminal Ofsout.

Figure 31:
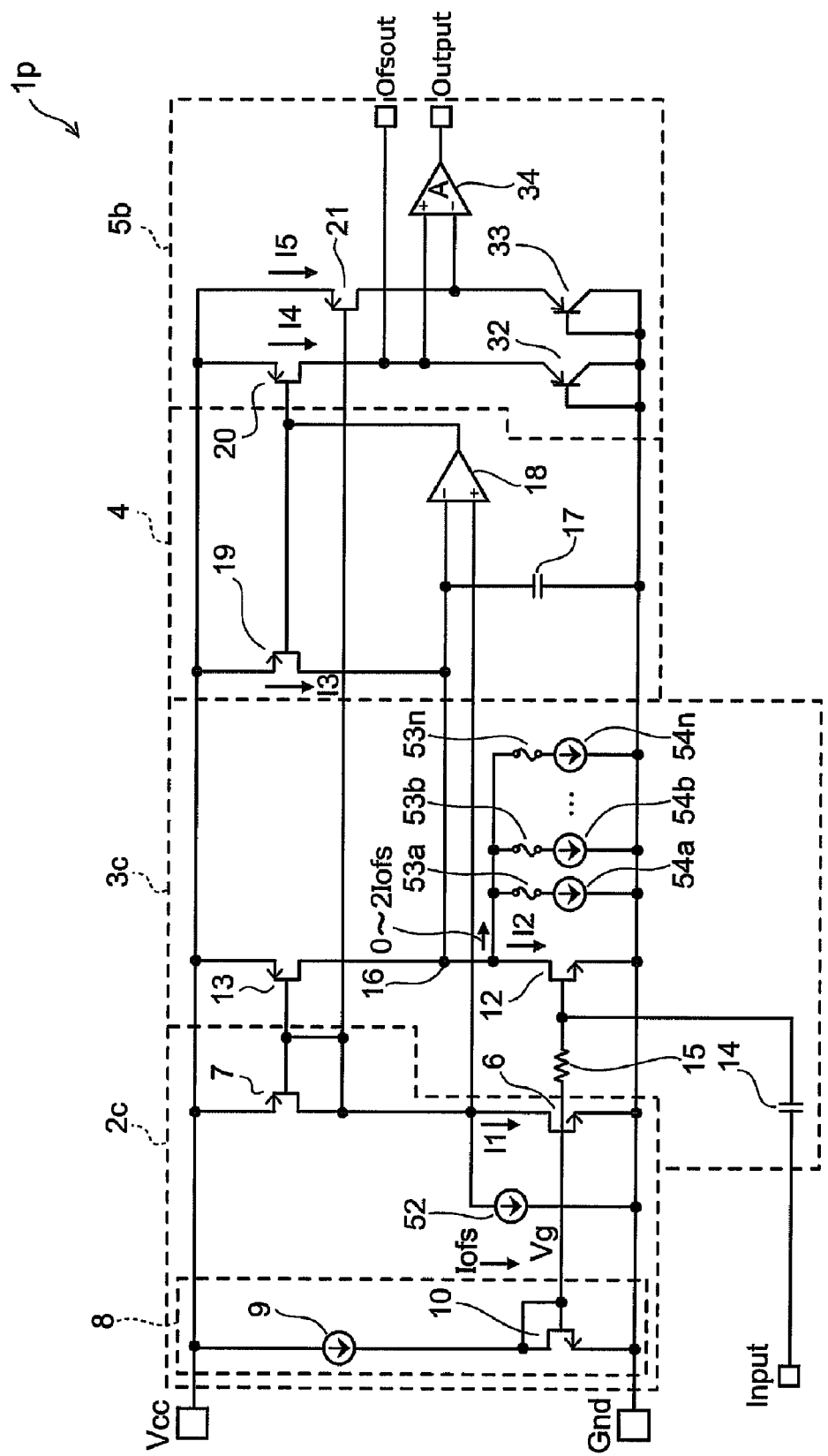
FIG. 31 is a circuit diagram illustrating yet another configuration of the power detector according to the tenth embodiment.

FIG. 31 is a circuit diagram illustrating yet another configuration of the power detector according to the tenth embodiment.

As illustrated in FIG. 31, a power detector 1p is configured in such a way that the output circuit 5a of the power detector in illustrated in FIG. 29 is replaced by the output circuit 5b illustrated in FIG. 30.

Also in the power detector 1p, the offset measurement terminal Ofsout is provided to detect the offset current more highly accurately as similar to FIG. 30.

Next, a method of setting the offset current will be described as the case is taken as an example in which the input fuse circuit and the first offset current generator are formed in four stages.

Figure 32:
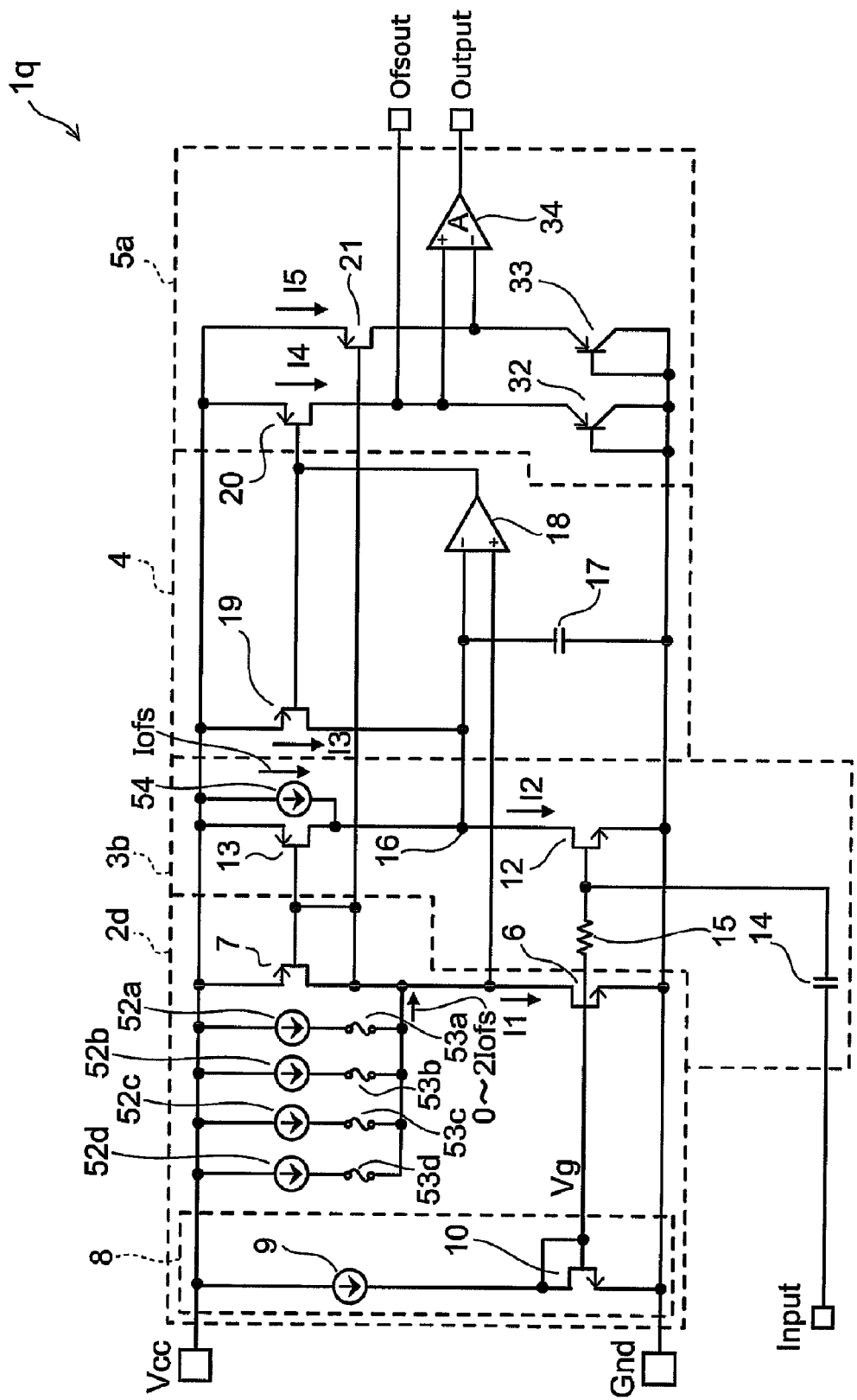
FIG. 32 is a circuit diagram illustrating still yet another configuration of the power detector according to the tenth embodiment.

FIG. 32 is a circuit diagram illustrating still yet another configuration of the power detector according to the tenth embodiment.

As illustrated in FIG. 32, a power detector 1q is configured in such a way that the reference voltage generator 2b of the power detector 1m illustrated in FIG. 27 is replaced by a reference voltage generator 2d.

In the reference voltage generator 2d, first offset current generators 52a, 52b, 52c, and 52d respectively supply offset currents Iofs/$2^0$, Iofs/$2^1$, Iofs/$2^2$, Iofs/$2^3$ to the drain of the first transistor 6 through input fuse circuits 53a, 53b, 53c, and 53d. Here, the value of the current Iofs is set to the maximum value that is assumed as the offset currents of the first and second transistors 6 and 12.

For example, the offset currents that the first offset current generators 52a, 52b, 52c, 52d generate are respectively 5 μA, 2.5 μA, 1.25 μA, and 0.625 μA, where Iofs=5 μA.

It is possible to set the currents supplied from the first offset current generators 52a, 52b, 52c, and 52d to the drain of the first transistor 6 in 16 steps within the range of 0 to 2Iofs, by disconnecting the input fuse circuits 53a, 53b, 53c, and 53n. In addition, a maximum current of about 2Iofs flows before disconnecting the input fuse circuits 53a, 53b to 53n, whereas the current value is zero if all the input fuse circuits are disconnected.

It is made possible to find the offset current Ioffset that is necessary to compensate the offset due to variations in production or the like by measuring the current between Ofsout and the ground Gnd under no-signal conditions.

FIG. 33 is a schematic view illustrating the relationship between the measured current value and the disconnecting value of the input fuse circuit in the power detector illustrated in FIG. 32.

In FIG. 33, the offset current Ioffset that is necessary to compensate the offset due to variations in production or the like, the measured offset value, and the disconnecting value of the input fuse circuit are expressed in a table, where the current Iofs=5 μA.

In addition, the current ratio of the first transistor 6 to the first output transistor 20 is ½, so that the value of the measured current is proportional to a half of the offset current Ioffset. Moreover, for the disconnecting value of the input fuse circuit, '1' expresses disconnecting, whereas '0' expresses not disconnecting.

It is possible to compensate the offset in the range of the offset current Ioffset=−5 to 5 μA, because of the setting of the current Iofs=5 μA.

For example, if the measured current value is 0 μA, the offset current Ioffset=−5 μA is held, and the input fuse circuits 53a, 53b, 53c, and 53d will not be disconnected. In addition, if the measured current value ranges from 2.5 to 2.8125 μA, the offset current Ioffset=0 to 0.625 μA is held, and the input fuse circuit 53a will be disconnected.

Figure 34:
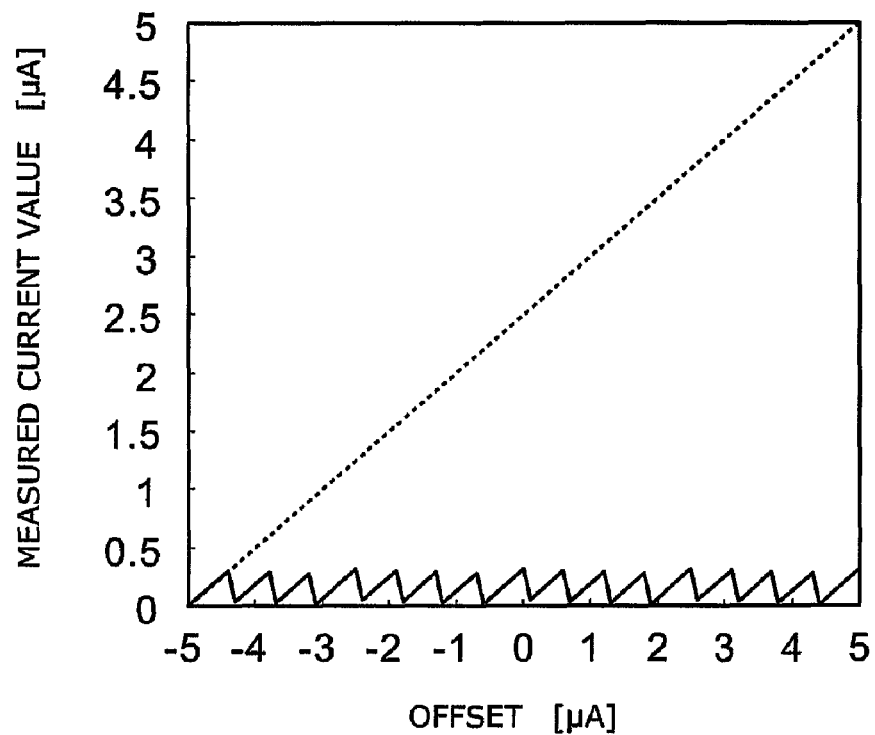
FIG. 34 is a graph illustrating the relationship between the offset and the measured current value in the power detector illustrated in FIG. 32.

FIG. 34 is a graph illustrating the relationship between the offset and the measured current value in the power detector illustrated in FIG. 32.

FIG. 34 schematically illustrates the relationship between the offset of the power detector 1q and the measured current flowing between the offset measurement terminal Ofsout and the ground Gnd under no-signal conditions. In addition, the value of the measured current before disconnecting the input fuse circuit is plotted by a broken line, and the value after disconnecting the input fuse circuit is plotted by a solid line.

It is possible to compensate the offset by disconnecting the input fuse circuits 53a, 53b, 53c, and 53d depending on the value of the measured current before disconnecting the input fuse circuit.

As discussed above, according to the power detectors 1o, 1p, and 1q, because the offset caused by the influence such as variations in production is cancelled, it is possible to extend the range that the linearity of the voltage of the output signal Output is provided as well under low input conditions where the input signal is low.

In addition, it is made possible to find the offset current highly accurately with no influence of the first converter 32 and the second operational amplifier 34.

Thus, it is made possible to extend the detectable input signal to the low power side. It is made possible to detect input signal power in a wide dynamic range. In addition, it is made possible to improve a response to a sudden power change in the input-output characteristics.

Eleventh Embodiment

Figure 35:
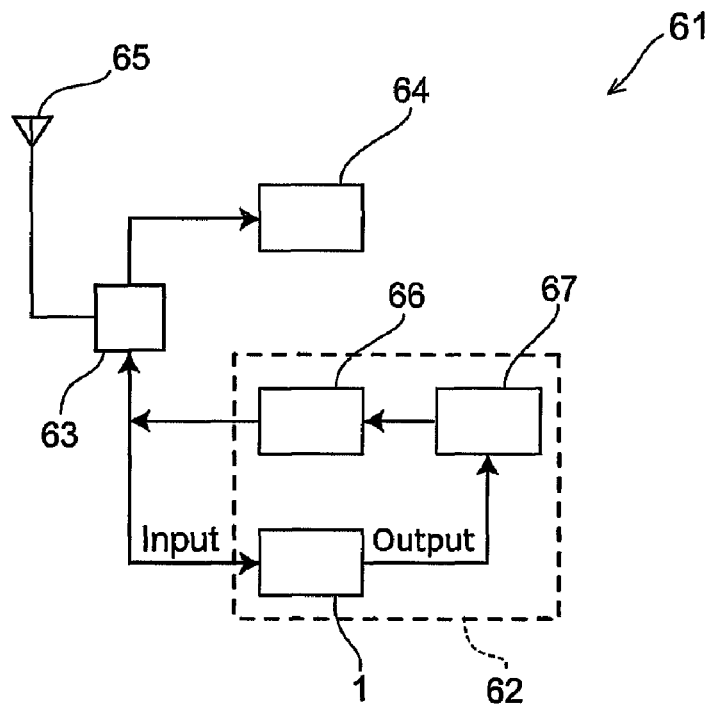
FIG. 35 is a circuit diagram illustrating the configuration of a wireless device according to an eleventh embodiment.

FIG. 35 is a circuit diagram illustrating the configuration of a wireless device according to an eleventh embodiment.

As illustrated in FIG. 35, a wireless device 61 includes a transmitting circuit 62, a duplexer 63, a receiving circuit 64, and an antenna 65.

The transmitting circuit 62 has the power detector 1, a transmission output circuit 66, and a transmission controller 67.

The power detector 1 detects the power of a transmitting signal outputted from the transmitting circuit 62, and outputs it to the transmission controller 67. The transmission controller 67 controls the transmission output circuit 66 to convert the power of the transmitting signal detected by the power detector 1 into a specified value. The transmission controller 67 modulates information such as an audio signal or image signal into a transmitting signal, and outputs the signal to the transmission output circuit 66.

The transmission output circuit 66 amplifies the transmitting signal outputted from the transmission controller 67 to the power of the specified value. In FIG. 35, an exemplary configuration is illustrated in which the transmission output circuit 66 is provided separately from the transmission controller 67. However, it is also possible to include the transmission output circuit 66 in the transmission controller 67.

The transmitting signal outputted from the transmission output circuit 66 is sent (radiated) from the antenna 65 through the duplexer 63.

A received signal received at the antenna 65 is inputted to the receiving circuit 64 through the duplexer 63 for demodulating information.

It is possible in the wireless device 61 that the power of the transmitting signal is detected by the power detector 1 and controlled to a specified value.

Moreover, FIG. 35 illustrates the configuration using the power detector 1. However, it is also possible to use the power detectors 1a to 1h. Furthermore, in the wireless device 61, the antenna 65 is connected to the transmitting circuit 62 and the receiving circuit 64 through the duplexer 63. However, it is also possible to use a high frequency switch.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A power detector comprising:
    a reference voltage generator configured to receive a bias voltage and generate a reference voltage;
    a square signal generator configured to receive a voltage having a high frequency input voltage superimposed on the bias voltage and output a signal including the reference voltage, a voltage of a square of the high frequency input voltage, and a high-frequency signal;
    a detection circuit having a first lowpass filter configured to filter out the high-frequency signal from the output signal of the square signal generator and output a mean value, a first operational amplifier configured to amplify error between an output voltage of the first lowpass filter and the reference voltage and output the error as a control voltage, and a feedback transistor configured to feed a feedback current according to the control voltage back to an output terminal of the square signal generator, the detection circuit being configured to reduce the error between the output voltage of the first lowpass filter and the reference voltage to detect high frequency power based on the feedback current; and
    an output circuit configured to output a voltage according to the control voltage.

2. The detector according to claim 1, wherein the output circuit includes
    a first output transistor configured to output a current according to the control voltage; and
    a first converter configured to receive the current of the first output transistor, convert the current into a voltage proportional to a logarithm of a current value, and output the voltage.

3. The detector according to claim 2, wherein:
    the output circuit further includes:
        a second operational amplifier;
        a first resistor, one end of the first resistor being connected to an output terminal of the second operational amplifier;
        a second resistor connected between one other end of the first resistor and a ground; and
        a first bipolar transistor, an emitter of the first bipolar transistor being connected to an inverting input terminal of the second operational amplifier, a collector of the first bipolar transistor being connected to the ground, and a base of the first bipolar transistor being connected to a connection point between the first resistor and the second resistor, and
    an output of the first converter is inputted to a non-inverting input terminal of the second operational amplifier.

4. The detector according to claim 2, wherein:
    the output circuit further includes a second lowpass filter configured to receive the current of the first output transistor, and
    the first converter receives the current of the first output transistor through the second lowpass filter.

5. The detector according to claim 4, wherein a cutoff frequency of the second lowpass filter is lower than a cutoff frequency of the first lowpass filter.

6. The detector according to claim 3, further comprising:
    a first current generator connected to the inverting input terminal of the first operational amplifier, a part of the feedback current flowing through the first current generator; and
    a second current generator connected to the non-inverting input terminal of the second operational amplifier, a part of the current of the first output transistor flowing through the second current generator.

7. The detector according to claim 3, wherein:
    the output circuit further includes:
        a first voltage generator configured to generate a voltage having temperature dependence; and
        a variable resistor connected to two ends of the first resistor or two ends of the second resistor and having a resistance controlled by an output of the first voltage generator, and
    a division ratio between the first resistor and the second resistor has temperature dependence caused by the variable resistor.

8. The detector according to claim 7, wherein the variable resistor includes:
    a third output transistor having a resistance controlled by the output of the first voltage generator; and
    an output fuse circuit connected to the third output transistor.

9. The detector according to claim 1, wherein the reference voltage generator includes:
    a first load circuit; and
    a first transistor connected between the first load circuit and a ground to receive the bias voltage and output a first current to the first load circuit.

10. The detector according to claim 9, wherein the square signal generator includes:
    a second load circuit forming a current mirror with the first load circuit; and
    a second transistor connected between the second load circuit and the ground to receive a voltage having the high frequency input voltage superimposed on the bias voltage and output a second current.

11. The detector according to claim 10, wherein:
    the reference voltage generator further includes:
        a first switch configured to be on in a first period and be off in a second period;
        a third operational amplifier configured to amplify error voltage between the output voltage of the reference voltage generator and the output voltage of the square signal generator through the first switch to feed a correction current back to the reference voltage generator; and
        a first capacitor configured to hold a voltage of the non-inverting input terminal of the third operational amplifier,
    the square signal generator further includes:
        a second switch configured to be off in the first period and be on in the second period to input the high frequency input voltage to the square signal generator, and
    the detection circuit further includes:
        a third switch configured to be off in the first period and be on in the second period to input the output of the square signal generator to the inverting input terminal of the first operational amplifier; and
        a fourth switch configured to be off in the first period to interrupt the feedback current and be on in the second period to feed the feedback current back from the detection circuit to the square signal generator.

12. The detector according to claim 10, wherein:
the reference voltage generator further includes a first offset current generator connected to the first transistor;
the square signal generator further includes a second offset current generator connected to the second transistor; and
at least one of the first current generator and the second current generator has a variable current value.

13. The detector according to claim 12, wherein the first offset current generator is connected to the first transistor through an input fuse circuit.

14. The detector according to claim 12, wherein the second offset current generator is connected to the second transistor through an input fuse circuit.

15. A wireless device comprising:
an antenna configured to radiate and receive a radio wave;
a receiving circuit configured to demodulate a received signal received from the antenna;
a transmitting circuit having a power detector configured to detect power of a transmitting signal, and a transmission controller configured to control the power of the transmitting signal to a specified value according to an output of the power detector, the transmitting circuit being configured to output the transmitting signal to the antenna, the power detector having:
  a reference voltage generator configured to receive a bias voltage and generate a reference voltage;
  a square signal generator configured to receive a voltage having a high frequency input voltage superimposed on the bias voltage and output a signal including the reference voltage, a voltage of a square of the high frequency input voltage, and a high-frequency signal;
  a detection circuit having a first lowpass filter configured to filter out the high-frequency signal from the output signal of the square signal generator and output a mean value, a first operational amplifier configured to amplify error between an output voltage of the first lowpass filter and the reference voltage and output the error as a control voltage, and a feedback transistor configured to feed a feedback current according to the control voltage back to an output terminal of the square signal generator, the detection circuit being configured to reduce the error between the output voltage of the first lowpass filter and the reference voltage to detect high frequency power based on the feedback current; and
  an output circuit configured to output a voltage according to the control voltage.

16. The device according to claim 15, wherein the output circuit includes:
  a first output transistor configured to output a current according to the control voltage; and
  a first converter configured to receive the current of the first output transistor, convert the current into a voltage proportional to a logarithm of a current value, and output the voltage.

17. The device according to claim 16, wherein:
the output circuit further includes:
  a second operational amplifier;
  a first resistor, one end of the first resistor being connected to an output terminal of the second operational amplifier;
  a second resistor connected between an other end of the first resistor and a ground; and
  a first bipolar transistor, an emitter of the first bipolar transistor being connected to an inverting input terminal of the second operational amplifier, a collector of the first bipolar transistor being connected to the ground, and a base of the first bipolar transistor being connected to a connection point between the first resistor and the second resistor, and
an output of the first converter is inputted to a non-inverting input terminal of the second operational amplifier.

18. The device according to claim 16, wherein:
the output circuit further includes a second lowpass filter configured to receive the current of the first output transistor, and
the first converter receives the current of the first output transistor through the second lowpass filter.

19. The device according to claim 17, further comprising:
a first current generator connected to the inverting input terminal of the first operational amplifier, a part of the feedback current flowing through the first current generator; and
a second current generator connected to the non-inverting input terminal of the second operational amplifier, a part of the current of the first output transistor flowing through the second current generator.

20. The device according to claim 17, wherein:
the output circuit further includes:
  a first voltage generator configured to generate a voltage having temperature dependence; and
  a third resistor connected to two ends of the first resistor or two ends of the second resistor and having a resistance controlled by an output of the first voltage generator, and
a division ratio between the first resistor and the second resistor has temperature dependence caused by the third resistor.

* * * * *